United States Patent
Busby et al.

(10) Patent No.: US 11,122,682 B2
(45) Date of Patent: Sep. 14, 2021

(54) TAMPER-RESPONDENT SENSORS WITH LIQUID CRYSTAL POLYMER LAYERS

(71) Applicant: INTERNATIONAL BUSINESS MACHINES CORPORATION, Armonk, NY (US)

(72) Inventors: James A. Busby, New Paltz, NY (US); John R. Dangler, Rochester, MN (US); Mark K. Hoffmeyer, Rochester, MN (US); William L. Brodsky, Binghamton, NY (US); William Santiago-Fernandez, Poughkeepsie, NY (US); David C. Long, Wappingers Falls, NY (US); Silvio Dragone, Olten (CH); Michael J. Fisher, Poughkeepsie, NY (US); Arthur J. Higby, Cottekill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 480 days.

(21) Appl. No.: 15/944,898

(22) Filed: Apr. 4, 2018

(65) Prior Publication Data
US 2019/0313526 A1    Oct. 10, 2019

(51) Int. Cl.
*H05K 1/18*        (2006.01)
*H05K 1/02*        (2006.01)
(Continued)

(52) U.S. Cl.
CPC ......... *H05K 1/0275* (2013.01); *G01N 27/041* (2013.01); *G01N 27/045* (2013.01);
(Continued)

(58) Field of Classification Search
CPC .... H05K 1/0275; H05K 1/0203; H05K 1/181; H05K 2201/10151
(Continued)

(56) References Cited

U.S. PATENT DOCUMENTS 3,165,569 A    1/1965   Bright et al.
4,160,503 A    7/1979   Ohlbach
(Continued)

FOREIGN PATENT DOCUMENTS

CN    2014-30639 Y    3/2010
CN    10-4346587 A    2/2015
(Continued)

OTHER PUBLICATIONS

Holm, Ragnar, "Electric Contacts: Theory and Application", Spinger-Verlag, New York, 4th Edition, 1981 (pp. 10-19).
(Continued)

*Primary Examiner* — Binh B Tran
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies and fabrication methods are provided which utilize liquid crystal polymer layers in solid form. The tamper-respondent assemblies include a circuit board, and an enclosure assembly mounted to the circuit board to enclose one or more electronic components coupled to the circuit board within a secure volume. The assembly includes a tamper-respondent sensor that is a three-dimensional multilayer sensor structure, which includes multiple liquid crystal polymer layers, and at least one tamper-detect circuit. The at least one tamper-detect circuit includes one or more circuit lines in a tamper-detect pattern disposed on at least one liquid crystal polymer layer of the multiple liquid crystal polymer layers. Further, a monitor circuit is provided disposed within the secure volume to monitor the at least one tamper-detect circuit of the tamper-respondent sensor for a tamper event.

14 Claims, 15 Drawing Sheets

(51) Int. Cl.
*G01N 27/04* (2006.01)
*H05K 5/00* (2006.01)

(52) U.S. Cl.
CPC ........... *H05K 1/0203* (2013.01); *H05K 1/181* (2013.01); *H05K 2201/10151* (2013.01)

(58) Field of Classification Search
USPC ........................................................ 361/748
See application file for complete search history.

(56) References Cited

U.S. PATENT DOCUMENTS

| | | | |
|---|---|---|---|
| 4,211,324 A | 7/1980 | Ohlback |
| 4,324,823 A | 4/1982 | Ray, III |
| 4,516,679 A | 5/1985 | Simpson |
| 4,496,900 A | 6/1985 | Di Stefano et al. |
| 4,593,384 A | 6/1986 | Kleijne |
| 4,609,104 A | 9/1986 | Kasper et al. |
| 4,653,252 A | 3/1987 | Van de Haar et al. |
| 4,677,809 A | 7/1987 | Long et al. |
| 4,691,350 A | 9/1987 | Kleijne et al. |
| 4,807,284 A | 2/1989 | Kleijne |
| 4,811,288 A | 3/1989 | Kleijne et al. |
| 4,860,351 A | 8/1989 | Weingart |
| 4,865,197 A | 9/1989 | Craig |
| 5,009,311 A | 4/1991 | Schenk |
| 5,027,397 A | 6/1991 | Double et al. |
| 5,060,114 A | 10/1991 | Feinberg et al. |
| 5,075,822 A | 12/1991 | Baumler et al. |
| 5,117,457 A | 5/1992 | Comerford et al. |
| 5,159,629 A | 10/1992 | Double et al. |
| 5,185,717 A | 2/1993 | Mori |
| 5,201,868 A | 4/1993 | Johnson |
| 5,201,879 A | 4/1993 | Steele et al. |
| 5,211,618 A | 5/1993 | Stoltz |
| 5,239,664 A | 8/1993 | Verrier et al. |
| 5,381,599 A | 1/1995 | Hall |
| 5,389,738 A | 2/1995 | Piosenka et al. |
| 5,406,630 A | 4/1995 | Piosenka et al. |
| 5,506,566 A | 4/1996 | Oldfield et al. |
| 5,568,124 A | 10/1996 | Joyce et al. |
| 5,594,439 A | 1/1997 | Swanson |
| 5,675,319 A | 10/1997 | Rivenberg et al. |
| 5,715,652 A | 2/1998 | Stahlecker |
| 5,761,054 A | 6/1998 | Kuhn |
| 5,813,113 A | 9/1998 | Stewart et al. |
| 5,858,500 A | 1/1999 | MacPherson |
| 5,880,523 A | 3/1999 | Candelore |
| 5,988,510 A | 11/1999 | Tuttle et al. |
| 6,121,544 A | 9/2000 | Petsinger |
| 6,195,267 B1 | 2/2001 | MacDonald, Jr. et al. |
| 6,201,296 B1 | 3/2001 | Fries et al. |
| 6,233,339 B1 | 5/2001 | Kawano et al. |
| 6,259,363 B1 | 7/2001 | Payne |
| 6,261,215 B1 | 7/2001 | Imer |
| 6,301,096 B1 | 10/2001 | Wozniczka |
| 6,384,397 B1 | 5/2002 | Takiar et al. |
| 6,420,971 B1 | 7/2002 | Leck et al. |
| 6,424,954 B1 | 7/2002 | Leon |
| 6,438,825 B1 | 8/2002 | Kuhm |
| 6,469,625 B1 | 10/2002 | Tomooka |
| 6,473,995 B2 | 11/2002 | Miyakawa et al. |
| 6,512,454 B2 | 1/2003 | Miglioli et al. |
| 6,686,539 B2 | 2/2004 | Farquhar et al. |
| 6,746,960 B2 | 6/2004 | Goodman et al. |
| 6,798,660 B2 | 9/2004 | Moss et al. |
| 6,817,204 B2 | 11/2004 | Bash et al. |
| 6,853,093 B2 | 2/2005 | Cohen et al. |
| 6,879,032 B2 | 4/2005 | Rosenau et al. |
| 6,929,900 B2 | 8/2005 | Farquhar et al. |
| 6,946,960 B2 | 9/2005 | Sisson et al. |
| 6,957,345 B2 | 10/2005 | Cesana et al. |
| 6,970,360 B2 | 11/2005 | Sinha |
| 6,985,362 B2 | 1/2006 | Mori et al. |
| 6,991,961 B2 | 1/2006 | Hubbard et al. |
| 6,996,953 B2 | 2/2006 | Perreault et al. |
| 7,005,733 B2 | 2/2006 | Kommerling et al. |
| 7,015,823 B1 | 5/2006 | Gillen et al. |
| 7,054,162 B2 | 5/2006 | Benson et al. |
| 7,057,896 B2 | 6/2006 | Matsuo et al. |
| 7,094,143 B2 | 8/2006 | Wolm et al. |
| 7,094,459 B2 | 8/2006 | Takahashi |
| 7,095,615 B2 | 8/2006 | Nichols |
| 7,156,233 B2 | 1/2007 | Clark et al. |
| 7,180,008 B2 | 2/2007 | Heitmann et al. |
| 7,189,360 B1 | 3/2007 | Ho et al. |
| 7,214,874 B2 | 5/2007 | Dangler et al. |
| 7,247,791 B2 | 7/2007 | Kulpa |
| 7,304,373 B2 | 12/2007 | Taggart et al. |
| 7,310,737 B2 | 12/2007 | Patel et al. |
| 7,465,887 B2 | 12/2008 | Suzuki et al. |
| 7,475,474 B2 | 1/2009 | Heitmann et al. |
| 7,515,418 B2 | 4/2009 | Straznicky et al. |
| 7,549,064 B2 | 6/2009 | Elbert et al. |
| 7,640,658 B1 | 1/2010 | Pham et al. |
| 7,643,290 B1 | 1/2010 | Narasimhan et al. |
| 7,663,883 B2 | 2/2010 | Shirakami et al. |
| 7,672,129 B1 | 3/2010 | Ouyang et al. |
| 7,731,517 B2 | 6/2010 | Lee et al. |
| 7,746,657 B2 | 6/2010 | Oprea et al. |
| 7,760,086 B2 | 7/2010 | Hunter et al. |
| 7,768,005 B2 | 8/2010 | Condorelli et al. |
| 7,783,994 B2 | 8/2010 | Ball et al. |
| 7,787,256 B2 | 8/2010 | Chan et al. |
| 7,788,801 B2 | 9/2010 | Oggioni et al. |
| 7,868,411 B2 | 1/2011 | Eaton et al. |
| 7,898,413 B2 | 3/2011 | Hsu et al. |
| 7,901,977 B1 | 3/2011 | Angelopoulos et al. |
| 7,923,830 B2 | 4/2011 | Pope et al. |
| 7,947,911 B1 | 5/2011 | Pham et al. |
| 7,963,395 B2 | 6/2011 | Sandberg |
| 7,978,070 B2 | 7/2011 | Hunter |
| 8,006,101 B2 | 8/2011 | Crawford |
| 8,084,855 B2 | 12/2011 | Lower et al. |
| 8,094,450 B2 | 1/2012 | Cole et al. |
| 8,133,621 B2 | 3/2012 | Wormald et al. |
| 8,101,267 B2 | 6/2012 | Moh et al. |
| 8,199,506 B2 | 6/2012 | Janik et al. |
| 8,287,336 B2 | 10/2012 | Dangler et al. |
| 8,325,486 B2 | 12/2012 | Arshad et al. |
| 8,345,423 B2 | 1/2013 | Campbell et al. |
| 8,455,990 B2 | 6/2013 | Warren et al. |
| 8,516,269 B1 | 8/2013 | Hamlet et al. |
| 8,589,703 B2 | 11/2013 | Lee et al. |
| 8,646,108 B2 | 2/2014 | Shiakallis et al. |
| 8,659,506 B2 | 2/2014 | Nomizo |
| 8,659,908 B2 | 2/2014 | Adams et al. |
| 8,664,047 B2 | 3/2014 | Lower et al. |
| 8,716,606 B2 | 5/2014 | Kelley et al. |
| 8,730,715 B2 | 5/2014 | Katti et al. |
| 8,797,059 B2 | 8/2014 | Boday et al. |
| 8,836,509 B2 | 9/2014 | Lowy |
| 8,853,839 B2 | 10/2014 | Gao et al. |
| 8,879,266 B2 | 11/2014 | Jarvis et al. |
| 8,890,298 B2 | 11/2014 | Buer et al. |
| 8,947,889 B2 | 2/2015 | Kelley et al. |
| 8,961,280 B2 | 2/2015 | Dangler et al. |
| 9,003,199 B2 | 4/2015 | Dellmo et al. |
| 9,011,762 B2 | 4/2015 | Seppa et al. |
| 9,052,070 B2 | 6/2015 | Davis et al. |
| 9,166,586 B2 | 10/2015 | Carapelli et al. |
| 9,298,956 B2 | 3/2016 | Wade et al. |
| 9,430,680 B2* | 8/2016 | Obukhov ................ G06F 21/87 |
| 9,436,293 B2 | 9/2016 | Faoro |
| 9,554,477 B1* | 1/2017 | Brodsky ............... G08B 13/128 |
| 9,555,606 B1 | 1/2017 | Fisher et al. |
| 9,560,737 B2 | 1/2017 | Issacs et al. |
| 9,578,764 B1 | 2/2017 | Fisher et al. |
| 9,591,776 B1 | 3/2017 | Brodsky et al. |
| 9,661,747 B1 | 5/2017 | Brodsky et al. |
| 9,717,154 B2 | 7/2017 | Brodsky et al. |
| 9,730,315 B1 | 8/2017 | Razaghi |
| 9,858,776 B1 | 1/2018 | Busby et al. |
| 9,877,383 B2 | 1/2018 | Brodsky et al. |

(56) References Cited

U.S. PATENT DOCUMENTS

| | | |
|---|---|---|
| 2001/0050425 A1 | 12/2001 | Beroz et al. |
| 2001/0056542 A1 | 12/2001 | Cesana et al. |
| 2002/0002683 A1 | 1/2002 | Benson |
| 2002/0068384 A1 | 6/2002 | Beroz et al. |
| 2002/0084090 A1 | 7/2002 | Farquhar |
| 2003/0009684 A1 | 1/2003 | Schwenck et al. |
| 2003/0179955 A1 | 9/2003 | Rehwinkel |
| 2005/0068735 A1 | 3/2005 | Fissore et al. |
| 2005/0111194 A1 | 5/2005 | Sohn et al. |
| 2005/0180104 A1 | 8/2005 | Olesen et al. |
| 2006/0034731 A1 | 2/2006 | Lewis et al. |
| 2006/0072288 A1 | 4/2006 | Stewart et al. |
| 2006/0196945 A1 | 9/2006 | Mendels |
| 2006/0218779 A1 | 10/2006 | Ooba et al. |
| 2007/0064396 A1 | 3/2007 | Oman et al. |
| 2007/0064399 A1 | 3/2007 | Mandel et al. |
| 2007/0108619 A1 | 5/2007 | Hsu |
| 2007/0211436 A1 | 9/2007 | Robinson et al. |
| 2007/0223165 A1 | 9/2007 | Itri et al. |
| 2007/0230127 A1 | 10/2007 | Peugh et al. |
| 2007/0268671 A1 | 11/2007 | Brandenburg et al. |
| 2008/0050512 A1 | 2/2008 | Lower et al. |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1 | 10/2008 | Eaton et al. |
| 2009/0073659 A1 | 3/2009 | Peng et al. |
| 2009/0166065 A1 | 7/2009 | Clayton et al. |
| 2010/0088528 A1 | 4/2010 | Sion |
| 2010/0110647 A1 | 5/2010 | Hiew et al. |
| 2010/0134959 A1 | 6/2010 | Fife et al. |
| 2010/0177487 A1 | 7/2010 | Arshad et al. |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0241446 A1 | 10/2011 | Tucholski |
| 2011/0299244 A1 | 12/2011 | Dede et al. |
| 2012/0050998 A1 | 3/2012 | Klum et al. |
| 2012/0117666 A1 | 5/2012 | Oggioni et al. |
| 2012/0140421 A1 | 6/2012 | Kirstine et al. |
| 2012/0319986 A1 | 6/2012 | Toh et al. |
| 2012/0185636 A1 | 7/2012 | Leon et al. |
| 2012/0244742 A1 | 9/2012 | Wertz et al. |
| 2012/0256305 A1 | 10/2012 | Kaufmann et al. |
| 2012/0320529 A1 | 12/2012 | Loong et al. |
| 2013/0033818 A1 | 2/2013 | Hosoda et al. |
| 2013/0104252 A1 | 4/2013 | Yanamadala et al. |
| 2013/0141137 A1 | 6/2013 | Krutzik et al. |
| 2013/0158936 A1 | 6/2013 | Rich et al. |
| 2013/0170217 A1 | 7/2013 | Lee |
| 2013/0208422 A1 | 8/2013 | Hughes et al. |
| 2013/0235527 A1 | 9/2013 | Wagner et al. |
| 2013/0283386 A1 | 10/2013 | Lee |
| 2014/0022733 A1 | 1/2014 | Lim et al. |
| 2014/0160679 A1 | 6/2014 | Kelty et al. |
| 2014/0184263 A1 | 7/2014 | Ehrenpfordt et al. |
| 2014/0204533 A1 | 7/2014 | Abeyasekera et al. |
| 2014/0321064 A1 | 10/2014 | Bose et al. |
| 2014/0325688 A1 | 10/2014 | Cashin et al. |
| 2015/0007427 A1 | 1/2015 | Dangler et al. |
| 2015/0163933 A1 | 6/2015 | Steiner |
| 2015/0235053 A1 | 8/2015 | Lee et al. |
| 2016/0005262 A1 | 1/2016 | Hirato et al. |
| 2016/0012693 A1 | 1/2016 | Sugar |
| 2016/0137548 A1 | 5/2016 | Cabral, Jr. et al. |
| 2016/0262253 A1 | 9/2016 | Isaacs et al. |
| 2016/0262270 A1 | 9/2016 | Isaacs et al. |
| 2017/0019987 A1 | 1/2017 | Dragone et al. |
| 2017/0020003 A1 | 1/2017 | Dragone et al. |
| 2017/0089729 A1 | 3/2017 | Brodsky et al. |
| 2017/0089977 A1 | 3/2017 | Warnock et al. |
| 2017/0091491 A1 | 3/2017 | Dangler et al. |
| 2017/0091492 A1 | 3/2017 | Brodsky et al. |
| 2017/0094778 A1 | 3/2017 | Brodsky et al. |
| 2017/0094783 A1 | 3/2017 | Dangler et al. |
| 2017/0094784 A1 | 3/2017 | Brodsky et al. |
| 2017/0094803 A1 | 3/2017 | Dangler et al. |
| 2017/0094804 A1 | 3/2017 | Brodsky et al. |
| 2017/0094805 A1 | 3/2017 | Dangler et al. |
| 2017/0094806 A1 | 3/2017 | Brodsky et al. |
| 2017/0094808 A1 | 3/2017 | Brodsky et al. |
| 2017/0094820 A1 | 3/2017 | Brodsky et al. |
| 2017/0094847 A1 | 3/2017 | Fisher et al. |
| 2017/0108543 A1 | 4/2017 | Brodsky et al. |
| 2017/0111998 A1 | 4/2017 | Brodsky et al. |
| 2017/0116439 A1 | 4/2017 | Sarafianos et al. |
| 2017/0116830 A1 | 4/2017 | Isaacs et al. |
| 2017/0156223 A1 | 6/2017 | Fisher et al. |
| 2017/0171999 A1 | 6/2017 | Fisher et al. |
| 2017/0249813 A1 | 8/2017 | Busby et al. |
| 2017/0316228 A1 | 11/2017 | Campbell et al. |
| 2017/0330844 A1 | 11/2017 | Busby et al. |
| 2017/0332485 A1 | 11/2017 | Busby et al. |
| 2018/0061196 A1 | 3/2018 | Busby et al. |
| 2018/0070444 A1 | 3/2018 | Brodsky et al. |
| 2018/0082556 A1 | 3/2018 | Dragone et al. |
| 2018/0092203 A1 | 3/2018 | Dragone et al. |
| 2018/0092204 A1 | 3/2018 | Dragone et al. |

FOREIGN PATENT DOCUMENTS

| | | |
|---|---|---|
| DE | 19816571 A1 | 10/1999 |
| DE | 19816572 A1 | 10/1999 |
| DE | 10-2012-203955 A1 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1 462 907 A1 | 9/2004 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2013/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/189483 A1 | 12/2013 |
| WO | WO 2014/086987 A2 | 6/2014 |
| WO | WO 2014/158159 A1 | 10/2014 |

OTHER PUBLICATIONS

Clark, Andrew J., "Physical Protection of Cryptographic Devices", Advanced on Cyprtology, Eurocrypt '87, Springer, Berlin Heidelberg (1987) (11 pages).

Halperin et al., "Latent Open Testing of Electronic Packaging", MCMC-194, IEEE (1994) (pp. 83-33).

Simek, Bob, "Tamper Restrictive Thermal Ventilation System for Enclosures Requiring Ventilation and Physical Security", IBM Publication No. IPCOM000008607D, Mar. 1, 1998 (2 pages).

Pamula et al., "Cooling of Integrated Circuits Using Droplet-Based Microfluidics", Association for Computing Machinery (ACM), GLSVLSI'03, Apr. 28-29, 2003 (pp. 84-87).

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

(56) References Cited

OTHER PUBLICATIONS

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Drimer et al., "Thinking Inside the Box: System-Level Failures of Tamper Proofing", 2008 IEEE Symposium on Security and Privacy, (Feb. 2008) (pp. 281-295).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Sample et al., "Design of an RFID-Based Battery-Free Programmable Sensing Platform", IEEE Transactions on Instrumentation and Measurement, vol. 57, No. 11, Nov. 2008 (pp. 2608-2615).

Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).

Anonymous, "Consolidated Non-Volatile Memory in a Chip Stack", IBM Technical Disclosure: IP.com No. IPCOM000185250, Jul. 16, 2009 (6 pages).

Isaacs et al., "Tamper Proof, Tamper Evident Encryption Technology", Pan Pacific Symposium SMTA Proceedings (2013) (9 pages).

Anonymous, "Selective Memory Encryption", IBM Technical Disclosure: IP.com IPCOM000244183, Nov. 20, 2015 (6 pages).

Zhou et al., "Nonlinear Analysis for Hardware Trojan Detection", ICSPCC2015, IEEE (2015) (4 pages).

Harting Mitronics, "Safety Caps for Payment Terminals", http://harting-mitronics/ch/fileadmin/hartingmitronics/case_studies/Safety_caps_for_payment_terminals.pdf, downloaded Aug. 2016 (2 pages).

Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017.

Buby et al., "Tamper-Respondent Assemblies with Trace Regions of Increased Susceptibility to Breaking", U.S. Appl. No. 15/341,108, filed Nov. 2, 2016 (56 pages).

Brodsky et al., "Tamper-Respondent Assembly with Flexible Tamper-Detect Sensor(s) Overlying In-Situ-Formed Tamper-Detect Sensor", U.S. Appl. No. 15/430,842, filed Feb. 13, 2017 (61 pages).

Brodsky et al., "Overlapping, Discrete Tamper-Respondent Sensors", U.S. Appl. No. 15/819,540, filed Nov. 21, 2017 (111 pages).

Busby et al., "Tamper-Respondent Assembly with Nonlinearity Monitoring", U.S. Appl. No. 15/820,620, filed Nov. 22, 2017 (49 pages).

Brodsky et al., "Tamper-Respondent Assemblies with Enclosure-to-Board Protection", U.S. Appl. No. 15/827,275, filed Nov. 30, 2017 (54 pages).

Busby et al., "Tamper-Proof Electronic Packages Formed with Stressed Glass", U.S. Appl. No. 15/831,534, filed Dec. 5, 2017 (45 pages).

Busby et al, "Tamper-Proof Electronic Packages with Stressed Glass Component Substrate(s)", U.S. Appl. No. 15/831,554, filed Dec. 5, 2017 (56 pages).

Brodsky et al., "Tamper-Respondent Assemblies with Bond Protection", U.S. Appl. No. 15/835,557, filed Dec. 8, 2017 (111 pages).

Brodsky et al., "Tamper-Respondent Assemblies with Bond Protection", U.S. Appl. No. 15/835,569, filed Dec. 8, 2017 (108 pages).

Fisher et al., "Enclosure with Inner Tamper-Respondent Sensor(s) and Physical Security Element(s)", U.S. Appl. No. 15/835,585, filed Dec. 8, 2017 (113 pages).

Cambpell et al., "Tamper-Proof Electronic Packages with Two-Phase Dielectric Fluid", U.S. Appl. No. 15/836,958, filed Dec. 11, 2017 (60 pages).

Fisher et al., "Tamper-Respondent Assembly with Vent Structure", U.S. Appl. No. 15/836,966, filed Dec. 11, 2017 (61 pages).

Fadden et al., Enclosure-to-Board Interface with Tamper-Detect Circuit(s), U.S. Appl. No. 15/901,985, filed Feb. 22, 2018 (59 pages).

\* cited by examiner

TAMPER-RESPONDENT SENSORS WITH LIQUID CRYSTAL POLYMER LAYERS

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

SUMMARY

Provided herein, in one or more aspects, is a tamper-respondent assembly which includes a circuit board and an enclosure assembly mounted to the circuit board to enclose at least one electronic component coupled to the circuit board within at least one sealed chamber of a secure volume. The enclosure assembly includes a tamper-respondent sensor. The tamper-respondent sensor is a three-dimensional multilayer sensor structure that includes multiple liquid crystal polymer layers, and at least one tamper-detect circuit. The at least one tamper-detect circuit includes one or more circuit lines in a tamper-detect pattern disposed on at least one liquid crystal polymer layer of the multiple liquid crystal polymer layers. The enclosure assembly further includes a monitor circuit disposed within the secure volume to monitor the at least one tamper-detect circuit of the tamper-respondent sensor for a tamper event.

In another aspect, a tamper-respondent assembly is provided which includes a circuit board, multiple electronic components, a first enclosure assembly, a second enclosure assembly, and a monitor circuit. The circuit board includes a first side and a second side, with the first and second sides being opposite sides of the circuit board. The multiple electronic components include at least one first electronic component coupled to the first side of the circuit board and at least one second electronic component coupled to the second side of the circuit board. The first enclosure assembly is mounted to the first side of the circuit board to enclose the at least one first electronic component coupled to the first side of the circuit board within a first sealed chamber of a secure volume. The first enclosure assembly includes a first tamper-respondent sensor, the first tamper-respondent sensor being a first three-dimensional multilayer sensor structure having multiple liquid crystal polymer layers and at least one first tamper-detect circuit. The at least one first tamper-detect circuit includes one or more circuit lines in a tamper-detect pattern disposed on at least one liquid crystal polymer layer of the multiple liquid crystal polymer layers. The second enclosure assembly is mounted to the second side of the circuit board to enclose the at least one second electronic component coupled to the second side of the circuit board within a second sealed chamber of the secure volume. The second enclosure assembly includes a second tamper-respondent sensor, which is a second three-dimensional multilayer sensor structure, having multiple liquid crystal polymer layers and at least one second tamper-detect circuit. The at least one second tamper-detect circuit includes one or more circuit lines in a tamper-detect pattern disposed on at least one liquid crystal polymer layer of the multiple liquid crystal polymer layers of the second tamper-respondent sensor. The monitor circuit is disposed within the secure volume to monitor the at least one first tamper-detect circuit of the first tamper-respondent sensor and to monitor the at least one second tamper-detect circuit of the second tamper-respondent sensor for a tamper event.

In a further aspect, a method of fabricating a tamper-respondent assembly is provided. The method includes providing a circuit board, and mounting an enclosure assembly to the circuit board to enclose at least one electronic component coupled to the circuit board within at least one sealed chamber of a secure volume. The enclosure assembly includes a tamper-respondent sensor. The tamper-respondent sensor is a three-dimensional multilayer sensor structure which includes multiple liquid crystal polymer layers, and at least one tamper-detect circuit. The at least one tamper-detect circuit includes one or more circuit lines in a tamper-detect pattern disposed on at least one liquid crystal polymer layer of the multiple liquid crystal polymer layers. The enclosure assembly also includes a monitor circuit disposed within the secure volume to monitor the at least one tamper-detect circuit of the tamper-respondent sensor for a tamper event.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, for establishing a tamper-respondent assembly.

Figure 1:
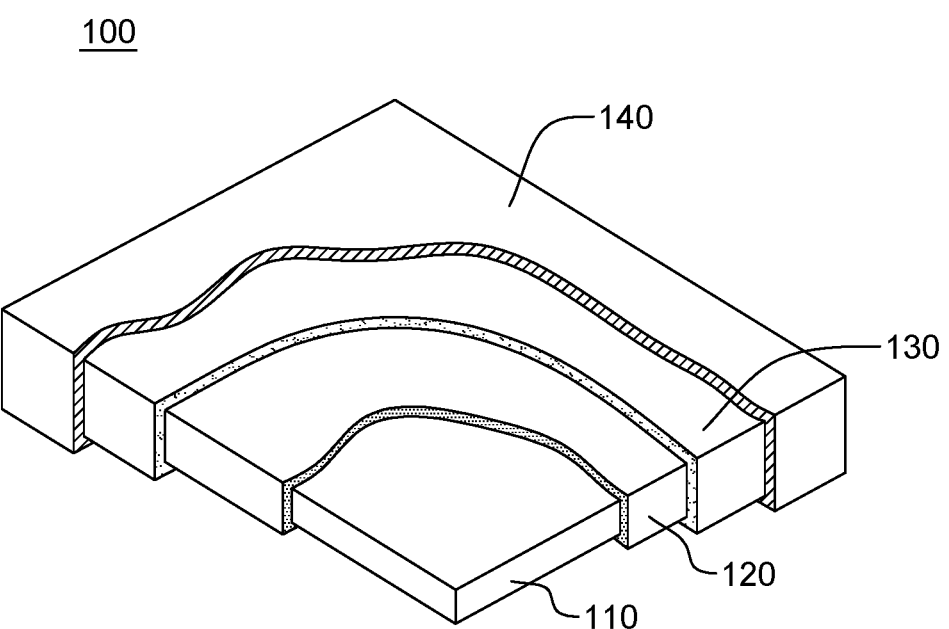
FIG. 1 is a partial cut-away of one embodiment of a tamper-proof electronic package.

Reference is first made to FIG. 1, which illustrates one approach for an electronic package 100 configured as a tamper-proof electronic package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may include security-sensitive information with, for instance, access to the information stored in the module requiring use of a variable key, and with the nature of the key being stored in the associated memory within the enclosure.

In one or more implementations, a tamper-proof electronic package or tamper-respondent assembly, such as depicted, is configured or arranged to detect attempts to tamper with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multilayer circuit board, such as a printed circuit board or other multilayer substrate, and be internally or externally powered via a power supply provided within the electronic assembly enclosure.

In the embodiment illustrated, and as one example only, electronic assembly enclosure 110 may be surrounded by a tamper-detection sensor 120, an encapsulant 130, and an outer, thermally conductive enclosure 140. In one or more implementations, tamper-detection sensor 120 may include a tamper-detection laminate that is folded around electronic assembly enclosure 110, and encapsulant 130 may be provided in the form of a molding. Tamper-detection sensor 120 may include various detection layers, which are monitored through, for instance, a ribbon cable by the enclosure monitor, against attempts to penetrate enclosure 110 and damage the enclosure monitor or erase circuit, before information can be erased from the encryption module. The tamper-detection sensor may be, for example, any such article commercially available or described in various publications and issued patents, or any enhanced article such as disclosed herein.

By way of example, tamper-detection sensor 120 may be formed as a tamper-detection laminate comprising a number of separate layers with, for instance, an outermost lamination-detection layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing conductive traces onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive material printed onto an extension of the film, if desired. Connections between the matrix and the ribbon cable may be made via connectors formed on one edge of the film. As noted, the laminate may be wrapped around the electronic assembly enclosure to define the tamper-detection sensor 120 surrounding enclosure 110.

In one or more implementations, the various elements of the laminate may be adhered together and wrapped around enclosure 110, in a similar manner to gift-wrapping a parcel, to define the tamper-detection sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-detection sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

To address the demands for ever-improving anti-intrusion technology, and the higher-performance encryption/decryption functions being provided, enhancements to a tamper-proof, tamper-evident packaging for one or more electronic components or assemblies are desired.

Numerous enhancements are described herein to, for instance, tamper-proof electronic packages or tamper-respondent assemblies. As noted, the numerous inventive aspects described herein may be used singly, or in any desired combination. Additionally, in one or more implementations, the enhancements described herein may be provided to work within defined space limitations for existing packages.

Disclosed hereinbelow with reference to FIGS. 2-14 are various approaches and/or enhancements to creating, for instance, a secure volume for accommodating one or more electronic components, such as one or more encryption and/or decryption modules and associated components of, for instance, a communications card or other electronic assembly to be protected.

Figure 2:
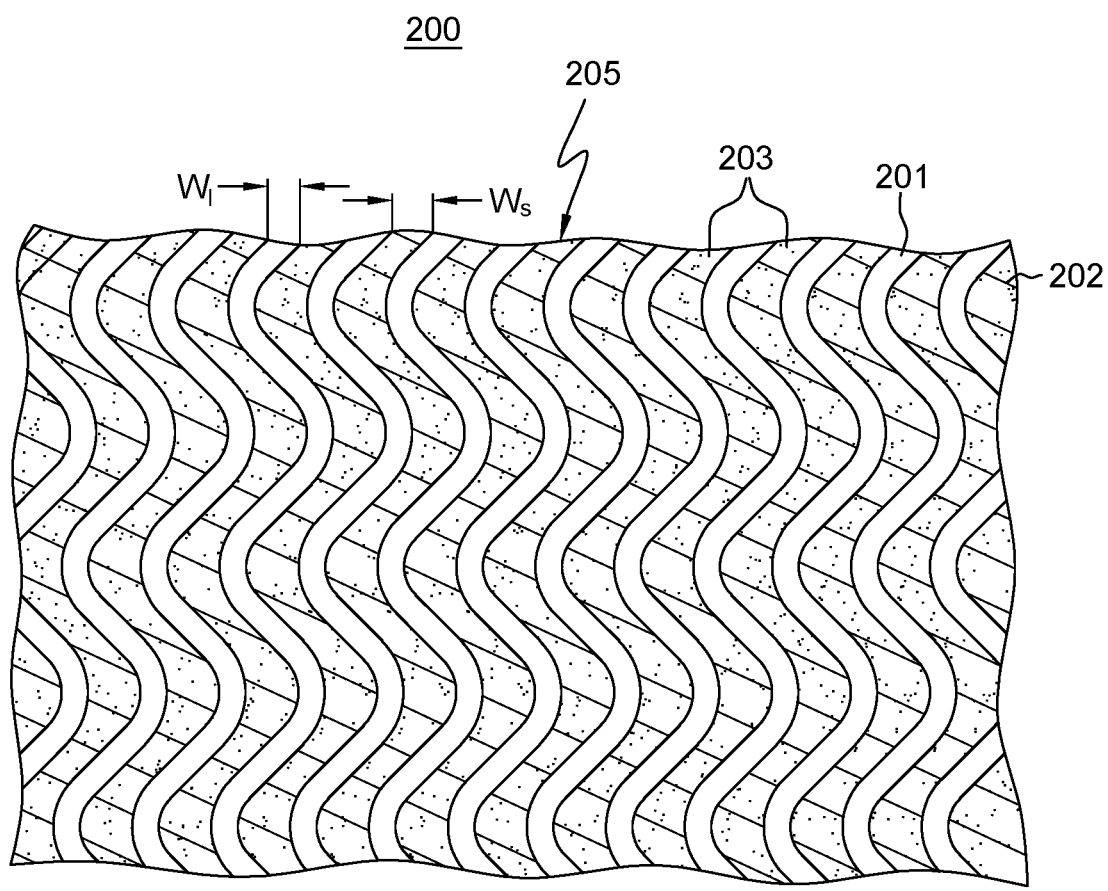
FIG. 2 depicts one embodiment of a tamper-respondent sensor with conductive lines forming, at least in part, at least one tamper-detect circuit, in accordance with one or more aspects of the present invention.

FIG. 2 depicts a portion of one embodiment of a tamper-detection layer 205 (or laser and pierce-respondent layer) of a tamper-respondent sensor 200 or security sensor, such as discussed herein. In FIG. 2, tamper-detection layer 205 includes circuit lines or traces 201 provided on one or both opposite sides of a layer, such as a flexible layer 202, which in one or more embodiments, may be a flexible insulating layer or film. Note that in one or more other embodiments described below the circuit lines or traces 201 may be disposed on one or more liquid crystal polymer layers of a three-dimensional multilayer sensor structure. The description of circuit lines or traces 201 provided herein is also applicable to circuit lines disposed on such liquid crystal polymer layers (in solid form).

FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. As described below, the circuit lines on one side of the flexible layer may be of a line width $W_l$ and have a pitch or line-to-line spacing $W_s$ such that piercing of the layer 205 at any point results in damage to at least one of the circuit lines traces 201. In one or more implementations, the circuit lines may be electrically connected in-series or parallel to define one or more conductors which may be electrically connected in a network to an enclosure monitor, which may, in one or more implementations, monitor the resistance of the lines. Detection of an increase, or other change, in resistance, caused by cutting or damaging one of the traces, will cause information within the encryption and/or decryption module to be erased. Providing conductive lines 201 in a pattern, such as a sinusoidal pattern, may advantageously make it more difficult to breach tamper-detection layer 205 without detection. Note, in this regard, that conductive lines 201 could be provided in any desired pattern. For instance, in an alternate implementation, conductive lines 201 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, as noted, the above-summarized tamper-respondent sensor 200 of FIG. 2 may be disposed over an outer surface of an enclosure, such as an enclosure described above in connection with FIG. 1. Alternatively, as described further herein, the tamper-respondent sensor may cover or line an inner surface of an enclosure to provide a secure volume about at least one electronic component to be protected. Still further, the tamper-respondent sensor, or more particularly, the tamper-detect circuit(s) of the sensor, could be embedded within a multilayer circuit board described below.

In one or more aspects, disclosed herein is a tamper-respondent sensor 200 with circuit lines 201 having reduced line widths $W_l$ of, for instance, 200 μm, or less, such as less than or equal to 100 μm, or even more particularly, in the range of 30-70 μm. This is contrasted with conventional trace widths, which are typically on the order of 250 μm or larger. Commensurate with reducing the circuit line width $W_l$, line-to-line spacing width $W_s$ 203 is also reduced to less than or equal to 200 μm, such as less than or equal to 100 μm, or for instance, in a range of 30-70 μm. Advantageously, by reducing the line width $W_l$ and line-to-line spacing $W_s$ of circuit lines 201 within tamper-respondent sensor 200, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected. Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 µm width line, it is more likely to reduce the line width sufficiently to detect the intrusion by a change in resistance. A change in a narrower line width is more likely to result in a detectable change in resistance, compared with, for instance, a 50% reduction in a more conventional line width of 350 µm to, for instance, 175 µm. The smaller the conductive circuit line width becomes, the more likely that a tampering of that line will be detected.

Note also that a variety of materials may advantageously be employed to form the circuit lines when implemented using resistance monitoring. For instance, the circuit lines may be formed of a conductive ink (such as a carbon-loaded conductive ink) printed onto one or both opposite sides of one or more of the flexible layers 202 in a stack of such layers. Alternatively, a metal or metal alloy could be used to form the circuit lines, such as copper, silver, intrinsically conductive polymers, carbon ink, or nickel-phosphorus (NiP), such as Omega-Ply®, offered by Omega Technologies, Inc. of Culver City, Calif. (USA), or nickel-chrome, such as Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 µm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In a further aspect, the flexible layer 202 itself may be further reduced in thickness from a typical polyester layer by selecting a crystalline polymer to form the flexible layer or substrate. By way of example, the crystalline polymer could include polyvinylidene difluoride (PVDF), or Kapton, or other crystalline polymer material. Advantageously, use of a crystalline polymer as the substrate film may reduce thickness of the flexible layer 202 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-detection layer stack, the stack thickness can be reduced from, for instance, 20 mils in the case of a typical polyester film, to 10 mils or less with the use of crystalline polymer films.

Figure 3A:
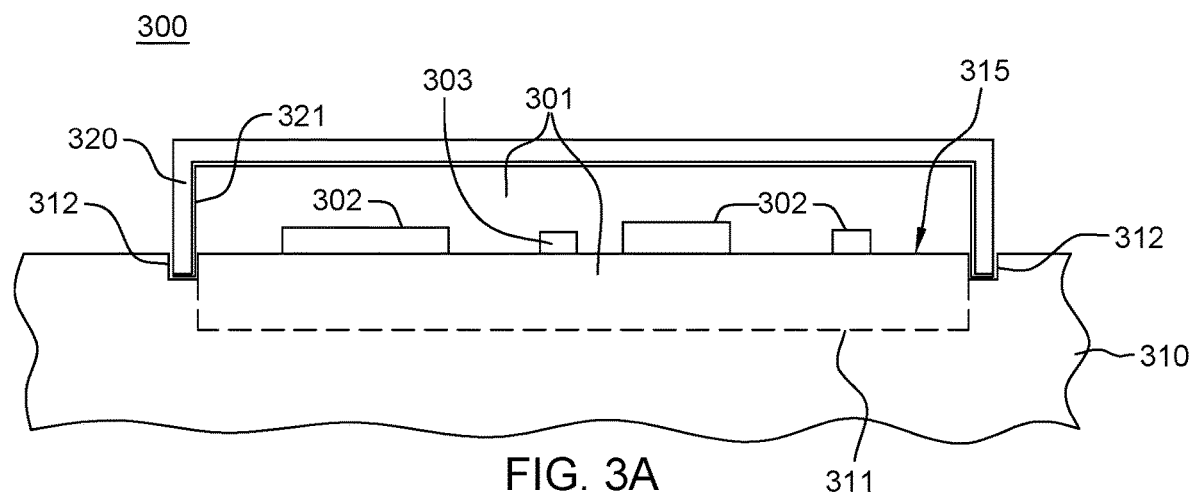
FIG. 3A is a cross-sectional elevational view of another embodiment of a tamper-proof electronic package, or tamper-respondent assembly, which includes (in part) an enclosure, and a multilayer circuit board with an embedded tamper-detect circuit, in accordance with one or more aspects of the present invention.
Figure 3B:
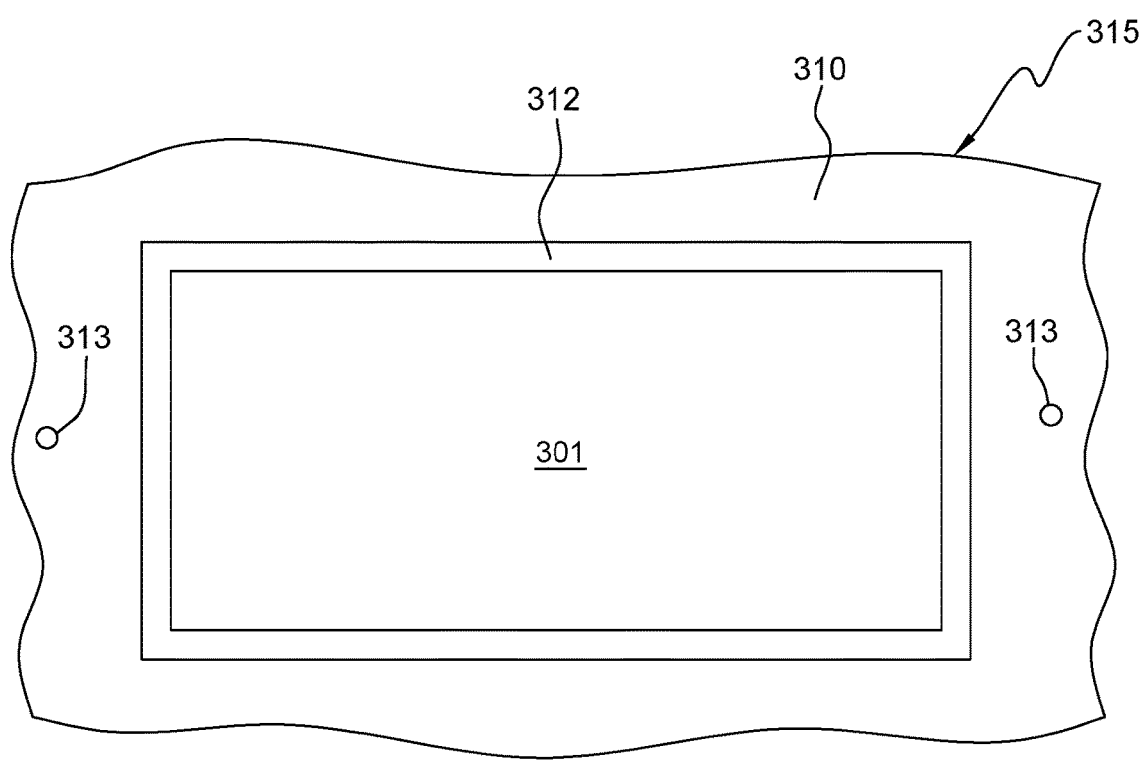
FIG. 3B is a top plan view of the multilayer circuit board of FIG. 3A, depicting one embodiment of the secure volume defined, in part, within the multilayer circuit board, in accordance with one or more aspects of the present invention.

FIGS. 3A & 3B depict one embodiment of a tamper-proof electronic package 300, or tamper-respondent assembly, which includes one or more electronic components, such as a circuit 315 and/or electronic devices (or elements) 302 to be protected, in accordance with one or more further aspects of the present invention.

Referring collectively to FIGS. 3A & 3B, circuit 315 resides on or is embedded within a multilayer circuit board 310, which also has an embedded tamper-respondent sensor 311 that facilitates defining, in part, a secure volume 301 associated with multilayer circuit board 310 that (in one or more embodiments) extends into multilayer circuit board 310. In particular, in the embodiment of FIGS. 3A & 3B, secure volume 301 may exist partially within multilayer circuit board 310, and partially above multilayer circuit board 310. One or more electronic devices 302 are mounted to multilayer circuit board 310 within secure volume 301 and may include, for instance, one or more encryption modules and/or decryption modules, and/or associated components, to be protected within the tamper-proof electronic package. In one or more implementations, the one or more electronic components to be protected may include, for instance, a secure communications card of a computer system.

Tamper-proof electronic package 300 further includes an enclosure 320, such as a pedestal-type enclosure, mounted to multilayer circuit board 310 within, for instance, a continuous groove (or trench) 312 formed within an upper surface of multilayer circuit board 310, and secured to the multilayer circuit board 310 via, for instance, a structural adhesive disposed within continuous groove 312. In one or more embodiments, enclosure 320 may include a thermally conductive material and operate as a heat sink for facilitating cooling of the one or more electronic components 302 within the secure volume. A security mesh or tamper-respondent sensor 321 may be associated with enclosure 320, for example, wrapping around the inner surface of enclosure 320, to facilitate defining, in combination with tamper-respondent sensor 311 embedded within multilayer circuit board 310, secure volume 301. In one or more implementations, tamper-respondent sensor 321 may extend down into continuous groove 312 in multilayer circuit board 310 and may, for instance, even wrap partially or fully around the lower edge of enclosure 320 within continuous groove 312 to provide enhanced tamper detection where enclosure 320 couples to multilayer circuit board 310. In one or more implementations, enclosure 320 may be securely affixed to multilayer circuit board 310 using, for instance, a bonding material such as an epoxy or other adhesive.

Briefly described, tamper-respondent sensor 321 may include, in one or more examples, one or more tamper-detection layers which include circuit lines or traces provided on one or both sides of a flexible layer, which in one or more implementations, may be a flexible insulating layer or film. The circuit lines on one or both sides of the flexible layer may be of a line width and have a pitch or line-to-line spacing such that piercing of the layer at any point results in damage to one or more of the circuit lines or traces. In one or more implementations, the circuit lines may define one or more conductors which may be electrically connected in a network to an enclosure monitor or detector 303, which monitors, for instance, resistance on the lines, or as described below, in the case of conductors, may monitor for a nonlinearity, or non-linear conductivity change, on the conductive lines. Detection of a change in resistance or a nonlinearity caused by cutting or damaging one or more of the lines, will cause information within the secure volume to be automatically erased. The conductive lines of the tamper-respondent sensor may be in any desired pattern, such as a sinusoidal pattern, to make it more difficult to breach the tamper-detection layer without detection.

For resistive monitoring, a variety of materials may be employed to form the circuit lines. For instance, the circuit lines may be formed of a metal or metal alloy, such as copper, or silver, or could be formed, for example, of an intrinsically-conductive polymer, carbon ink, or nickel phosphorous (NiP), or Omega-Ply®, offered by Omega Technologies, Inc., of Culver City, Calif. (USA), or Ticer™, offered by Ticer Technologies, Chandler, Ariz. (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, may be employed.

As noted, in one or more implementations, the circuit lines of the tamper-respondent sensor(s) lining the inner surface(s) of enclosure 320, or even printed directly onto one or more layers formed over the inner surface of enclosure 320, may be connected to define one or more detect networks.

If a flexible layer is used over the inner surface of enclosure 320, then the flexible layer may be formed of a crystalline polymer material. For instance, the crystalline polymer could include polyvinylidene difluoride (PVDF), or Kapton, or other crystalline polymer material. Advantageously, a crystalline polymer may be made much thinner, while still maintaining structural integrity of the flexible substrate, which also allows for enhanced folding, and greater reliability of the sensor after folding.

As depicted in FIG. 3B, one or more external circuit connection vias 313 may be provided within multilayer circuit board 310 for electrically connecting to the one or more electronic components within secure volume 301. These one or more external circuit connection vias 313 may electrically connect to one or more external signal lines or planes (not shown) embedded within multilayer circuit board 310 and extending, for instance, into a secure base region of (or below) secure volume 301, as explained further below. Electrical connections to and from secure volume 301 may be provided by coupling to such external signal lines or planes within the multilayer circuit board 310.

As noted, secure volume 301 may be sized to house one or more electronic components to be protected, and may be constructed to extend into multilayer circuit board 310. In one or more implementations, multilayer circuit board 310 includes electrical interconnect within the secure volume 301 defined in the board, for instance, for electrically connecting one or more tamper-detection layers of the embedded tamper-respondent sensor 311 to associated monitor circuitry also disposed within secure volume 301, along with, for instance, one or more daughter cards, such as memory DIMMs, PCIe cards, processor cards, etc.

Note that the packaging embodiment depicted in FIGS. 3A & 3B is presented by way of example only. Other configurations of enclosure 320, or multilayer circuit board 310 may be employed, and/or other approaches to coupling enclosure 320 and multilayer circuit board 310 may be used. For instance, in one or more alternate implementations described herein, enclosure 320 may be securely affixed to an upper surface of multilayer circuit board 310 (without a continuous groove) using, for instance, a structural bonding material such as an epoxy or other adhesive.

Figure 4:
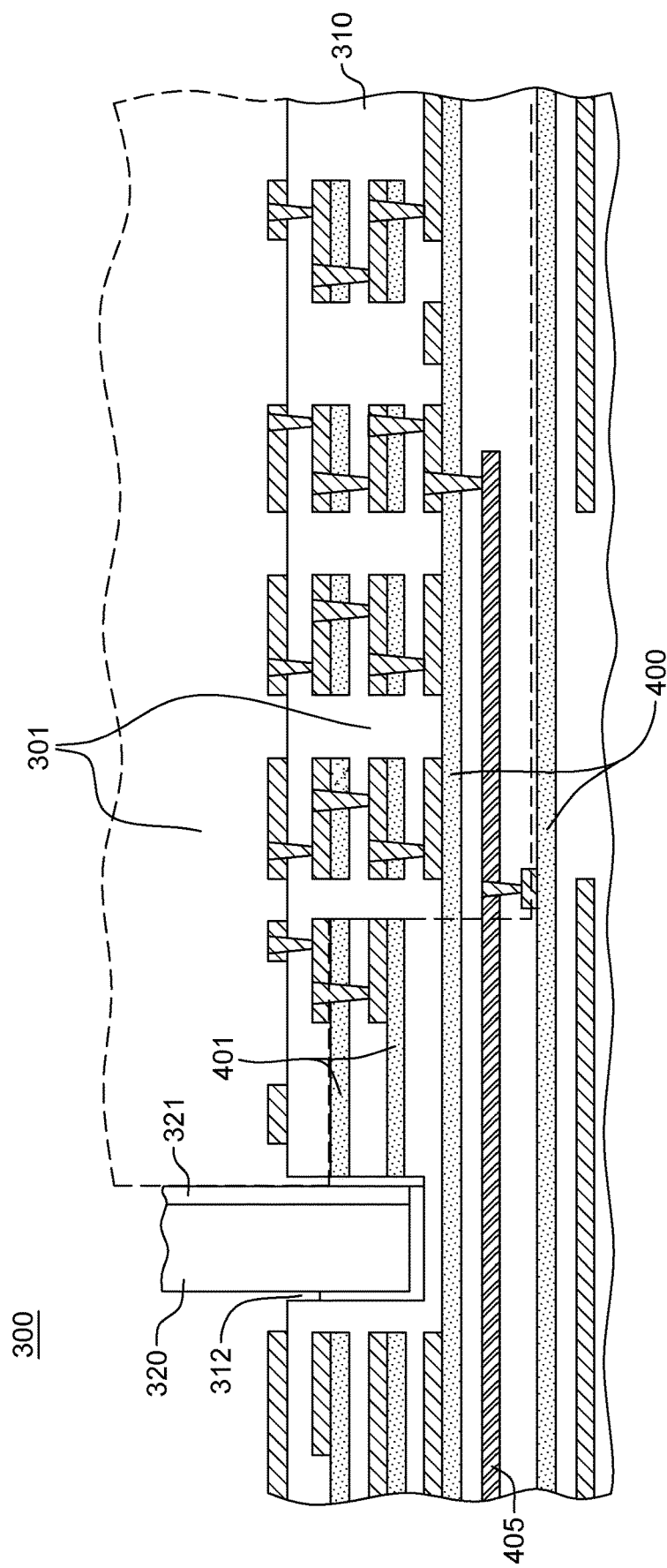
FIG. 4 is a partial cross-sectional elevational view of a more detailed embodiment of the tamper-respondent assembly of FIGS. 3A & 3B including (in part) an enclosure and a multilayer circuit board with embedded tamper-detect circuit, in accordance with one or more aspects of the present invention.

By way of further example, FIG. 4 depicts a partial cross-sectional elevational view of a more detailed embodiment of tamper-proof electronic package 300, and in particular, of multilayer circuit board 310, to which enclosure 320 is secured. In this configuration, the embedded tamper-respondent sensor includes multiple tamper-detection layers including, by way of example, at least one tamper-detection mat (or base) layer 400, and at least one tamper-detection frame 401. In the example depicted, two tamper-detection mat layers 400 and two tamper-detection frames 401 are illustrated, by way of example only. The lower-most tamper-detection mat layer 400 may be a continuous sense or detect layer extending completely below the secure volume being defined within and/or above multilayer circuit board 310. One or both tamper-detection mat layers 400 below secure volume 301 may be partitioned into multiple circuit zones. Within each tamper-detection mat layer, or more particularly, within each circuit zone of each tamper-detection mat layer, multiple circuits or conductive traces may be provided in any desired configuration. Further, the conductive traces within the tamper-detection layers may be implemented as, for instance, a resistive layer.

As illustrated, one or more external signal lines or planes 405 may enter secure volume 301 between, in one embodiment, two tamper-detection mat layers 400, and then electrically connect upwards into the secure volume 301 through one or more conductive vias, arranged in any desired location and pattern. In the configuration depicted, the one or more tamper-detection frames 401 are disposed at least inside of the area defined by continuous groove 312 accommodating the base of enclosure 320. Together with the tamper-respondent sensor(s) 321 associated with enclosure 320, tamper-detection frames 401, and tamper-detection mat layers 400, define secure volume 301, which may extend, in part, into multilayer circuit board 310. With secure volume 301 defined, in part, within multilayer circuit board 310, the external signal line(s) 405 may be securely electrically connected to, for instance, the one or more electronic components mounted to, or of, multilayer circuit board 310 within secure volume 301. In addition, secure volume 301 may accommodate electrical interconnection of the conductive traces of the multiple tamper-detection layers 400, 401, for instance, via appropriate monitor circuitry.

Added security may be provided by extending tamper-detection mat layers 400 (and if desired, tamper-detection frames 401) outward past the periphery of enclosure 320. In this manner, a line of attack may be made more difficult at the interface between enclosure 320 and multilayer circuit board 310 since the attack would need to clear, for instance, tamper-detection mat layers 400, the enclosure 320, as well as the tamper-detection frames 401 of the embedded tamper-detect circuit.

Numerous variations on multilayer circuit board 310 of FIGS. 3A-4 are possible. For instance, in one embodiment, the embedded tamper-detect circuit may include one or more tamper-detection mat layers 400 and one or more tamper-detection frames 401, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once the secure volume is defined in part within multilayer circuit board 310, conductive vias within the secure volume between layers of multilayer circuit board 310 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-detection layers of the multiple tamper-detection layers more difficult.

The tamper-detection layers of the embedded tamper-detect circuit formed within the multilayer circuit board of the electronic circuit or electronic package may include multiple conductive traces or lines formed between, for instance, respective sets of input and output contacts or vias at the trace termination points. Any pattern and any number of conductive traces or circuits may be employed in defining a tamper-detection layer or a tamper-detection circuit zone within a tamper-detection layer. For instance, 4, 6, 8, etc., conductive traces may be formed in parallel (or otherwise) within a given tamper-detection layer or circuit zone between the respective sets of input and output contacts to those conductive traces.

Figure 5:
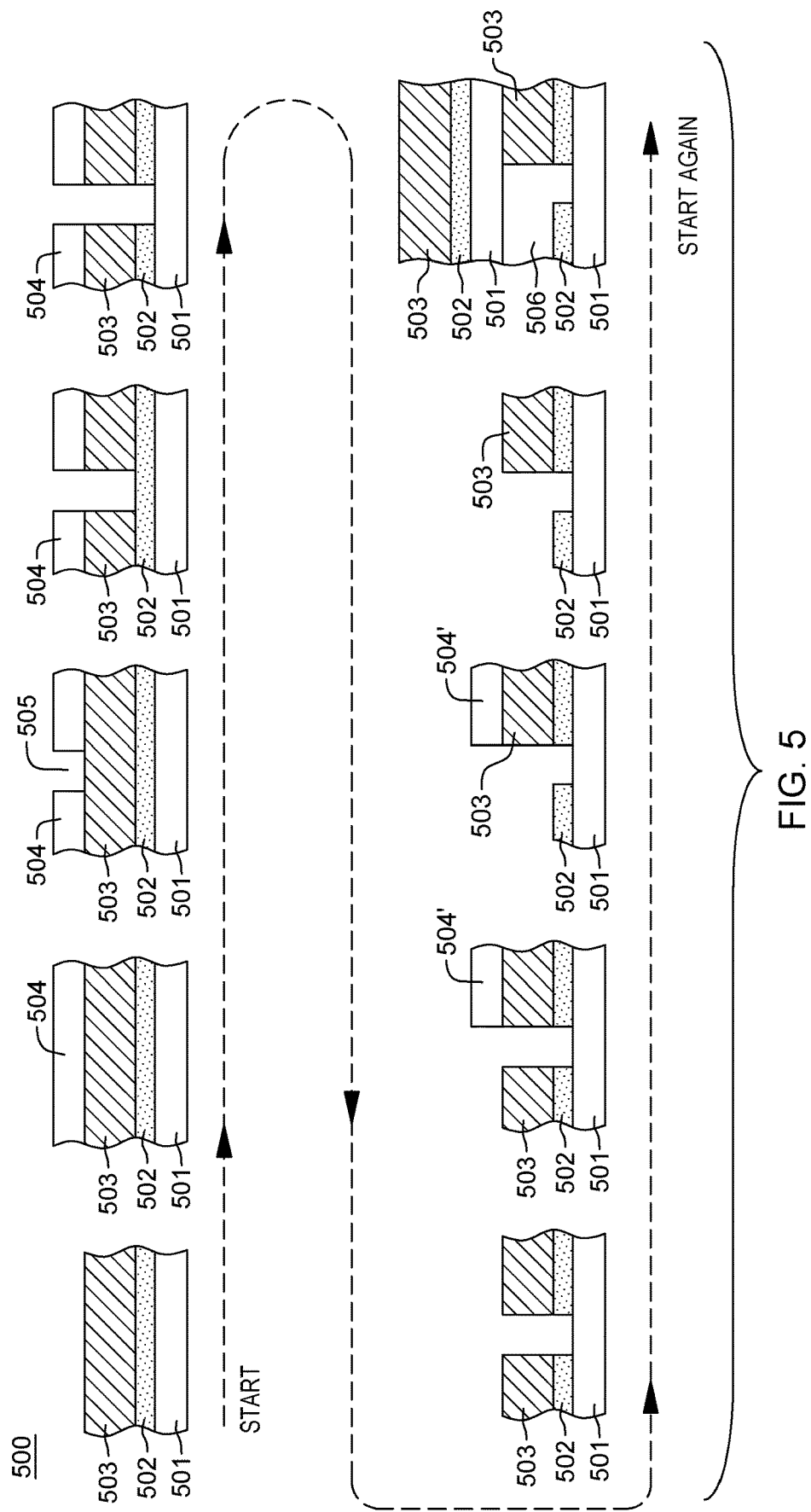
FIG. 5 depicts one embodiment of a process of fabricating a multilayer circuit board with an embedded tamper-detect circuit, in accordance with one or more aspects of the present invention.

In one or more implementations, the multilayer circuit board may be a multilayer wiring board or printed circuit board formed, for instance, by building up the multiple layers of the board. FIG. 5 illustrates one embodiment for forming and patterning a tamper-detection layer within such a multilayer circuit board.

As illustrated in FIG. 5, in one or more implementations, a tamper-detection layer, such as a tamper-detection mat layer or a tamper-detection frame disclosed herein, may be formed by providing a material stack comprising, at least in part, a structural layer 501, such as a pre-preg (or pre-impregnated) material layer, a trace material layer 502 for use in defining the desired trace patterns, and an overlying conductive material layer 503, to be patterned to define conductive contacts or vias electrically connecting to the pattern of traces being formed within the trace material layer 502, for instance, at trace terminal points. In one or more implementations, the trace material layer 502 may include nickel phosphorous (NiP), and the overlying conductive layer 503 may include copper. Note that these materials are identified by way of example only, and that other trace and/or conductive materials may be used within the build-up 500.

A first photoresist 504 is provided over build-up 500, and patterned with one or more openings 505, through which the overlying conductive layer 503 may be etched. Depending on the materials employed, and the etch processes used, a second etch process may be desired to remove portions of trace material layer 502 to define the conductive traces of the subject tamper-detection layer. First photoresist 504 may then be removed, and a second photoresist 504' is provided over the conductive layer 503 features to remain, such as the input and output contacts. Exposed portions of conductive layer 503 are then etched, and the second photoresist 504' may be removed, with any opening in the layer being filled, for instance, with an adhesive (or pre-preg) 506 and a next build-up layer is provided, as shown. Note that in this implementation, most of overlying conductive layer 503 is etched away, with only the conductive contacts or vias remaining where desired, for instance, at the terminal points of the traces formed within the layer by the patterning of the trace material layer 502. Note that any of a variety of materials may be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within the tamper-detection layers, and in particular, the tamper-detection circuit zones, of the embedded tamper-detect circuit, along with the tamper detector monitoring the enclosure, may be electrically connected to detect or compare circuitry provided, for instance, within secure volume 301 (FIG. 3A) of the tamper-proof electronic package. The detect circuitry may include various bridges or compare circuits, and conventional printed wiring board electrical interconnect inside secure volume 301 (FIG. 3A), for instance, located within the secure volume defined by the tamper-detection frames 401 (FIG. 4), and the tamper-detection mat layers 400 (FIG. 4).

Note that advantageously, different tamper-detection circuit zones on different tamper-detection layers may be electrically interconnected into, for instance, the same detect circuitry. Thus, any of a large number of interconnect configurations may be possible. For instance, if each of two tamper-detection mat layers contains 30 tamper-detection circuit zones, and each of two tamper-detection frames contains 4 tamper-detection circuit zones, then, for instance, the resultant 68 tamper-detection circuit zones may be connected in any configuration within the secure volume to create the desired arrangement of circuit networks within the secure volume being monitored for changes in resistance or tampering. Note in this regard, that the power supply or battery for the tamper-respondent sensor(s) may be located internal or external to the secure volume, with the sensor being configured to trip and destroy any protected or critical data if the power supply or battery is tampered with.

Figure 6:
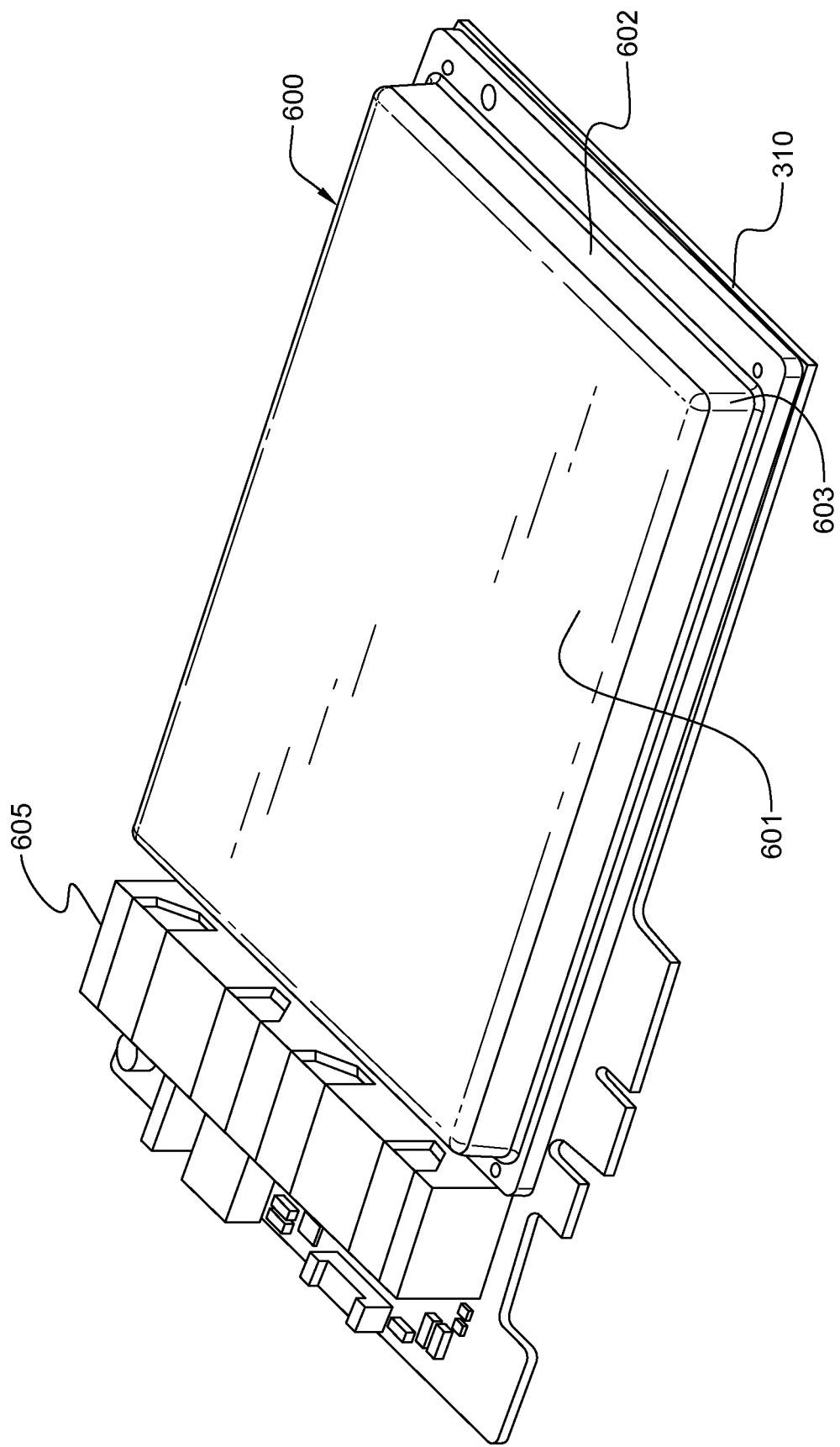
FIG. 6 is an isometric view of one embodiment of a tamper-respondent assembly, in accordance with one or more aspects of the present invention.

By way of further example, an isometric view of one embodiment of a tamper-proof electronic package is depicted in FIG. 6, wherein an enclosure 600 (such as enclosure 320 of FIG. 3A) is shown sealed to multilayer circuit board 310 to define a secure volume about one or more electronic components, as described herein. In the embodiment depicted, enclosure 600 may be formed of a thermally conductive material, and includes a main surface 601 and sidewall(s) 602 which include sidewall corners 603. An inner surface of enclosure 600 would include an inner main surface, and an inner sidewall surface corresponding to main surface 601 and sidewall(s) 602 respectively, with the inner main surface and inner sidewall surfaces being covered, at least in part, by one or more tamper-respondent sensors, such as described above. A power supply 605 or battery for the tamper-respondent sensor may be located, as depicted in this embodiment, external to the secure volume, with the tamper detector being configured to trip and destroy any protected or critical data if the power supply or battery is tampered with. Enclosure 600 may be adhered to multilayer circuit board 310, which as noted herein, may include its own tamper protection.

Figure 7A:
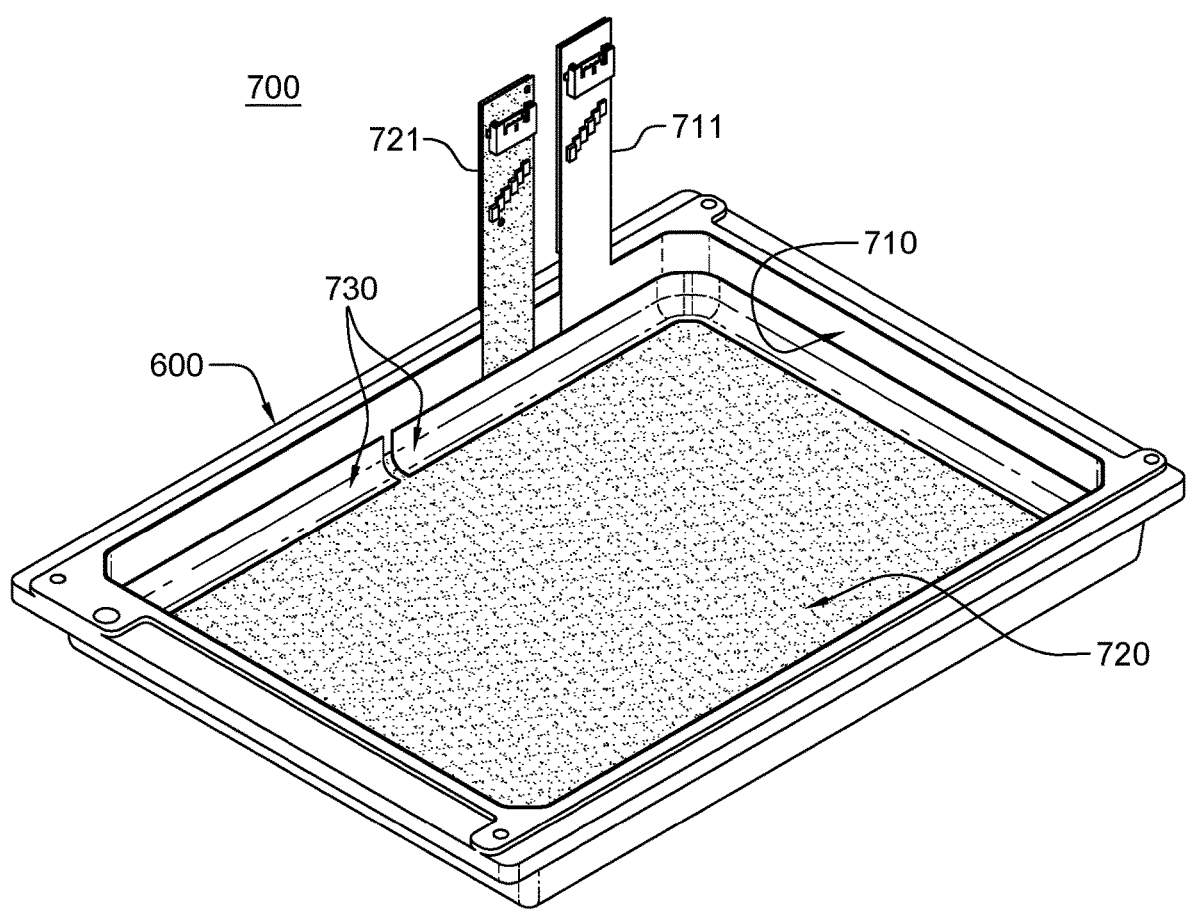
FIG. 7A depicts an underside, perspective view of one embodiment of a tamper-respondent assembly comprising an enclosure and multiple tamper-respondent sensors, in accordance with one or more aspects of the present invention.
Figure 7B:
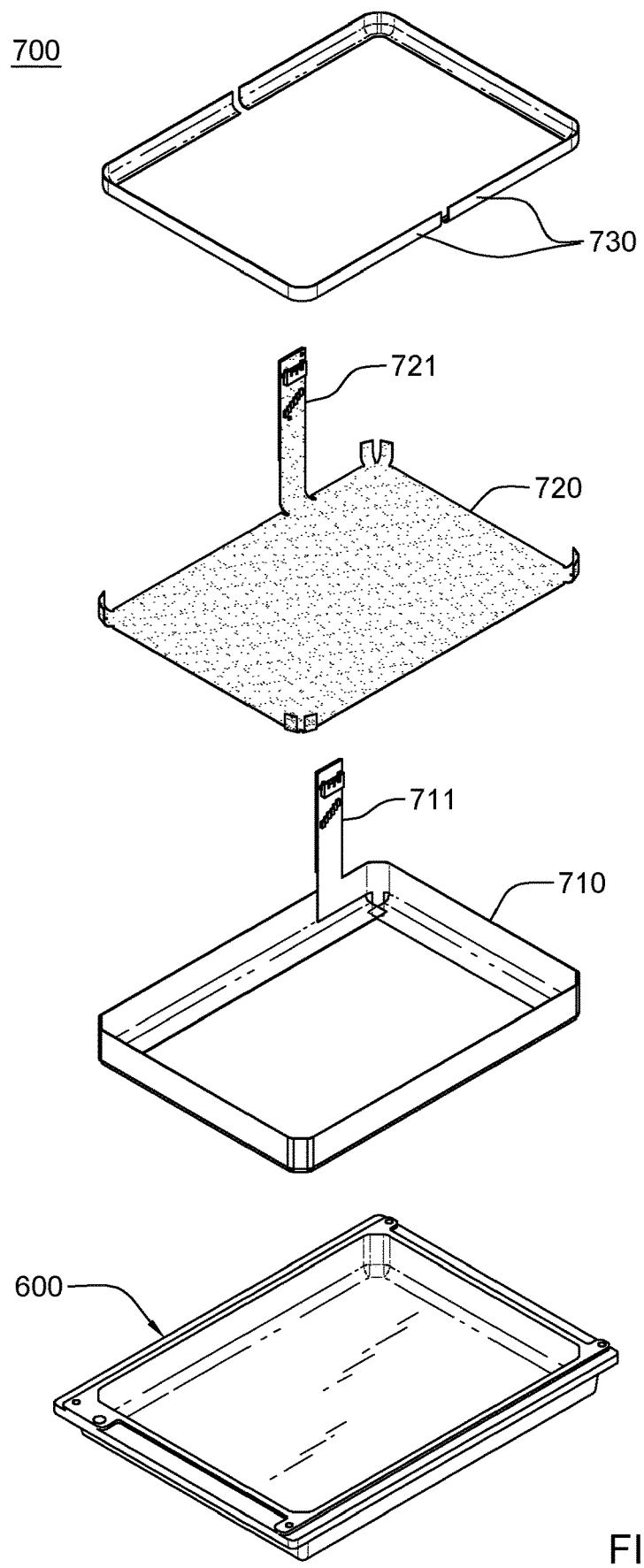
FIG. 7B depicts an exploded view of the tamper-respondent assembly of FIG. 7A, in accordance with one or more aspects of the present invention.

FIGS. 7A & 7B depict underside, isometric views of one embodiment of a tamper-respondent assembly employing an enclosure 600. Referring collectively to FIGS. 7A & 7B, in one or more implementations, tamper-respondent assembly 700 includes enclosure 600 which, as noted, is to enclose, at least in part, one or more electronic components or an electronic assembly to be protected, and associated with, for instance, a multilayer circuit board. Enclosure 600 includes an inner main surface, and an inner-sidewall surface including at least one inner-sidewall corner, such as described above in connection with FIG. 6. Further, tamper-respondent assembly 700 includes a tamper-respondent electronic circuit structure which includes at least one tamper-respondent sensor mounted to and covering, at least in part, the inner surface(s) of enclosure 600. As explained further below, the tamper-respondent sensor(s) is configured so as to facilitate good contact, and good adhesion, of the sensor to the inner surfaces of the enclosure, such as, for instance, the one or more inner-sidewall corners of the enclosure 600, to provide secure coverage of the tamper-respondent sensor(s) over the inner surface(s) of the enclosure.

As illustrated, in one or more implementations, the tamper-respondent electronic circuit structure associated with enclosure 600 may include an inner-sidewall tamper-respondent (or tamper-detect) sensor 710 and an inner main surface tamper-respondent (or tamper-detect) sensor 720, along with a security band or element 730. In the illustrated example, inner-sidewall tamper-respondent sensor 710 may be formed with an integrated flex ribbon cable or extension 711 to facilitate electrical connection of the at least one resistive network within inner-sidewall tamper-respondent sensor 710 to appropriate monitor circuitry (not shown) disposed within, for instance, the secure volume defined, at least in part, by the tamper-respondent assembly of FIGS. 7A & 7B. Similarly, inner main surface tamper-respondent sensor 720 may be configured with an integrated flex ribbon cable or extension 721 to facilitate electrical connection of inner main surface tamper-respondent sensor 720 to the monitor circuitry, as well. A bonding agent (discussed below), such as a thermoset adhesive, may be employed to adhere inner-sidewall tamper-respondent sensor 720 to the inner-sidewall surface and to inner-sidewall corners. A similar adhesive could be used to adhere inner main surface tamper-respondent sensor 720 to inner main surface and to inner-sidewall tamper-respondent sensor 710 where the sensors overlap. Security band 730 may further be adhesively secured over the overlap between inner main surface tamper-respondent sensor 720 and inner-sidewall tamper-respondent sensor 710 covering, in one or more implementations, transition regions between the inner-sidewall surface and the inner main surface around the inner perimeter of electronics enclosure 600.

Note that, in the example provided in FIGS. 7A & 7B, inner-sidewall tamper-respondent sensor 710 and inner main surface tamper-respondent sensor 720 are discrete tamper-respondent sensors that overlap, at least in part, and facilitate defining a secure volume about the at least one electronic component to be protected. For instance, the secure volume may be defined by flipping over and securing the illustrated tamper-respondent assembly of FIGS. 7A & 7B to a multilayer circuit board with an embedded tamper-respondent sensor, such as described above.

By way of further enhancement, the tamper-proof electronic package may be implemented differently to include one or more tamper-respondent sensors with liquid crystal polymer layers. As explained further below with reference to FIGS. 8A-14, tamper-respondent assemblies and fabrication methods are also provided herein which utilize one or more tamper-respondent sensors with liquid crystal polymer layers in solid form as a moldable multilayer sensor structure.

In one or more implementations, the tamper-respondent assembly may include a circuit board, and an enclosure assembly mounted to the circuit board to enclose one or more electronic components coupled to the circuit board within a secure volume. The enclosure assembly may include a tamper-respondent sensor that is a three-dimensional multilayer sensor structure, which as noted, includes multiple liquid crystal polymer layers, and at least one tamper-detect circuit. The at least one tamper-detect circuit may include one or more circuit lines in a tamper-detect pattern disposed on at least one liquid crystal polymer layer of the multiple liquid crystal polymer layers. Further, a monitor circuit may be provided disposed within the secure volume to monitor the at least one tamper-detect circuit of the tamper-respondent sensor for a tamper event.

In one or more embodiments, the tamper-respondent sensor may be a single, molded, three-dimensional multilayer sensor structure formed, at least in part, pursuant to a molding process. In certain embodiments, the enclosure assembly may include a cover, with the cover being defined by the molded, three-dimensional multilayer sensor structure itself, that is, without a separate cover structure. In one or more other implementations, the enclosure assembly may include a thermally conductive cover, with the three-dimensional multilayer sensor structure being affixed to an inner surface of the thermally conductive cover. In one or more embodiments, the tamper-respondent sensor may be a single, molded, three-dimensional multilayer sensor structure molded, at least in part, to conform to the inner surface of the thermally conductive cover. In certain embodiments, the thermally conductive cover may mount to the circuit board at an enclosure-to-board interface, and the tamper-respondent sensor may extend, at least in part, into the enclosure-to-board interface between the thermally conductive cover and the circuit board.

In one or more further embodiments, the tamper-respondent sensor may include a connection tab extending therefrom to facilitate electrically connecting the at least one tamper-detect circuit to the monitor circuit. Further, the circuit board may include a notch in a surface thereof within the secure volume. The connection tab of the tamper-respondent sensor may extend, at least in part, into the notch in the surface of the circuit board in an operative position connecting the at least one tamper-detect circuit to the monitor circuit.

In certain embodiments, the multiple liquid crystal polymer layers of the tamper-respondent sensor may be opaque layers. Further, in one or more embodiments, one or more circuit lines of the at least one tamper-detect circuit may be formed of a resistive material invisible to x-ray imaging.

In one or more implementations, one or more liquid crystal polymer layers of the multiple liquid crystal polymer layers of the tamper-respondent sensor may include structural filler material different from liquid crystal polymer material to, at least in part, provide enhanced structural rigidity to the one or more liquid crystal polymer layers to facilitate inhibiting penetration of the tamper-respondent sensor during the tamper event.

In one or more embodiments, at least two liquid crystal polymer layers of the multiple liquid crystal polymer layers may include filler material different from the liquid crystal polymer material itself. For instance, a first liquid crystal polymer layer of the at least two liquid crystal polymer layers may include a first concentration of the filler material, and a second liquid crystal polymer layer of the at least two liquid crystal polymer layers may include a second concentration of the filler material, where the first and second concentrations of the filler material are different, for instance, the first concentration of the filler material may be greater than the second. In certain embodiments, the second liquid crystal polymer layer of the at least two liquid crystal polymer layers may be disposed closer to the secure volume then the first liquid crystal polymer layer. Further, in one or more embodiments, one or more other liquid crystal polymer layers of the multiple liquid crystal polymer layers may be disposed in between the at least two liquid crystal polymer layers in the three-dimensional multi-sensor structure, where the one or more other liquid crystal polymer layers lack the filler material, or have less filler material than the at least two liquid crystal polymer layers, to facilitate bending of the structure during a tamper event, and thus detection of the tamper event.

In one or more detailed implementations, a tamper-respondent assembly may be provided herein including a circuit board, multiple electronic components, a first enclosure assembly, a second enclosure assembly, and a monitor circuit. The circuit board has a first side and a second side, with the first and second sides being opposite sides of the circuit board. The multiple electronic components may include at least one first electronic component coupled to the first side of the circuit board and at least one second electronic component coupled to the second side of the circuit board. The first enclosure assembly is mounted to the first side of the circuit board to enclose the at least one first electronic component coupled to the first side of the circuit board within a first sealed chamber of a secure volume. The first enclosure assembly may include a first tamper-respondent sensor, where the first tamper-respondent sensor is a first three-dimensional multilayer sensor structure that includes multiple liquid crystal polymer layers, and at least one tamper-detect circuit. The at least one first tamper-detect circuit includes one or more circuit lines in a tamper-detect pattern disposed on at least one liquid crystal polymer layer of the multiple liquid crystal polymer layers. The second enclosure assembly is mounted to the second side of the circuit board to enclose the at least one second electronic component coupled to the second side of the circuit board within a second sealed chamber of the secure volume. The second enclosure assembly includes a second tamper-respondent sensor, where the second tamper-respondent sensor is a second three-dimensional multilayer sensor structure which includes multiple liquid crystal polymer layers, and at least one second tamper-detect circuit. The at least one second tamper-detect circuit includes one or more circuit lines in a tamper-detect pattern disposed on at least one liquid crystal polymer layer of the multiple liquid crystal polymer layers of the second tamper-respondent sensor. The monitor circuit is disposed within the secure volume to monitor the at least one first tamper-detect circuit of the first tamper-respondent sensor and to monitor the at least one second tamper-detect circuit of the second tamper-respondent sensor for tamper event.

As explained further below with reference to the embodiments of FIG. 8A-14, three-dimensional structures are provided herein formed, in part, from layers of liquid crystal polymer material in solid form to provide, for instance, an inner tamper-respondent sensor within an outer cover of a secure enclosure assembly. As known, liquid crystal polymer material is a class of aromatic polymers that are unreactive and inert. The liquid crystal polymer material described herein is provided in solid form in one or more layers of a multilayer sensor structure. A variety of processes may be utilized to form the individual liquid crystal polymer layers, including application of heat and pressure on the material coupled with molding tools, or by directly molding the layers into the component housing (i.e., enclosure assembly).

Electronically conductive material, or circuit lines, may be provided in a tamper-detect pattern on one or more liquid crystal polymer layers of the liquid-crystal polymer structure configured to detect intrusion attempts through the sensor structure. The tamper-detect circuit(s) may be electrically connected to a tamper-monitoring circuit (or mechanism) disposed, for instance, within the secure volume. The circuit lines in the tamper-detect pattern of the tamper-detect circuit(s) may be created using various materials and in various configurations, such as described above in connection with FIG. 2. For instance, serpentine traces may be employed on one or more layers of the multiple liquid crystal polymer layers in the liquid crystal polymer structure, for instance, with one or more of the liquid crystal polymer layers being a circuit dielectric base layer. By way of example, the circuit lines may be formed of conductive material, such as copper or a copper alloy, or resistive material, such as NiP or NiCr, discussed above. Multiple serpentine layers with staggered via interconnects may be employed between different liquid crystal polymer layers of the three-dimensional multilayer sensor structure to enhance security effectiveness. The three-dimensional multilayer sensor structure may be molded with temperature and pressure treatment to conform to, for instance, an inner surface of a cover, such as a thermally conductive cover. This molding may occur post circuitization, that is, after formation of the three-dimensional multilayer sensor structure with the tamper-detect circuit(s) on the one or more multiple liquid crystal polymer layers. A tamper event may be triggered on any attempt, mechanical, electrical, and/or chemical to penetrate the three-dimensional multilayer structure.

In one or more implementations, the liquid crystal polymer material itself may provide opacity of the enclosure assembly, preventing intruders from having visibility to the circuit lines of the tamper-detect circuit(s). Use of resistive materials may also make the patterned circuit lines invisible to x-ray imaging. In one or more implementations, one or more of the liquid crystal polymer layers may be modified with filler content. For instance, glass, silica, ceramic, etc. particles may be introduced as a structural filler to make the resultant three-dimensional sensor structure harder to penetrate. The liquid crystal polymer layers may also be tailored with local and/or variable filler content or variable sensor layer count to enhance, for instance, mechanical flexure, and thereby tamper event detection via a bending of an attempted tamper event through the structure. In certain embodiments, liquid crystal polymer compliant features may extend from, for instance, the circuit board or base card to provide interconnect to other tamper components, tamper-detection constructions, or tamper monitoring circuitry. Further, the three-dimensional multilayer sensor structure may be bonded to, for instance, an outer cover with a thermally conductive structural adhesive that would make it difficult to separate the sensor structure from the cover, and therefore difficult to bypass the tamper-detect circuit(s) on the multiple liquid crystal polymer layers. Advantageously, by incorporating liquid crystal polymer layers into the three-dimensional multilayer sensor structure, the fabrication process for the secure enclosure assembly (of the tamper-respondent assembly) may be streamlined and enhanced.

Figure 8A:
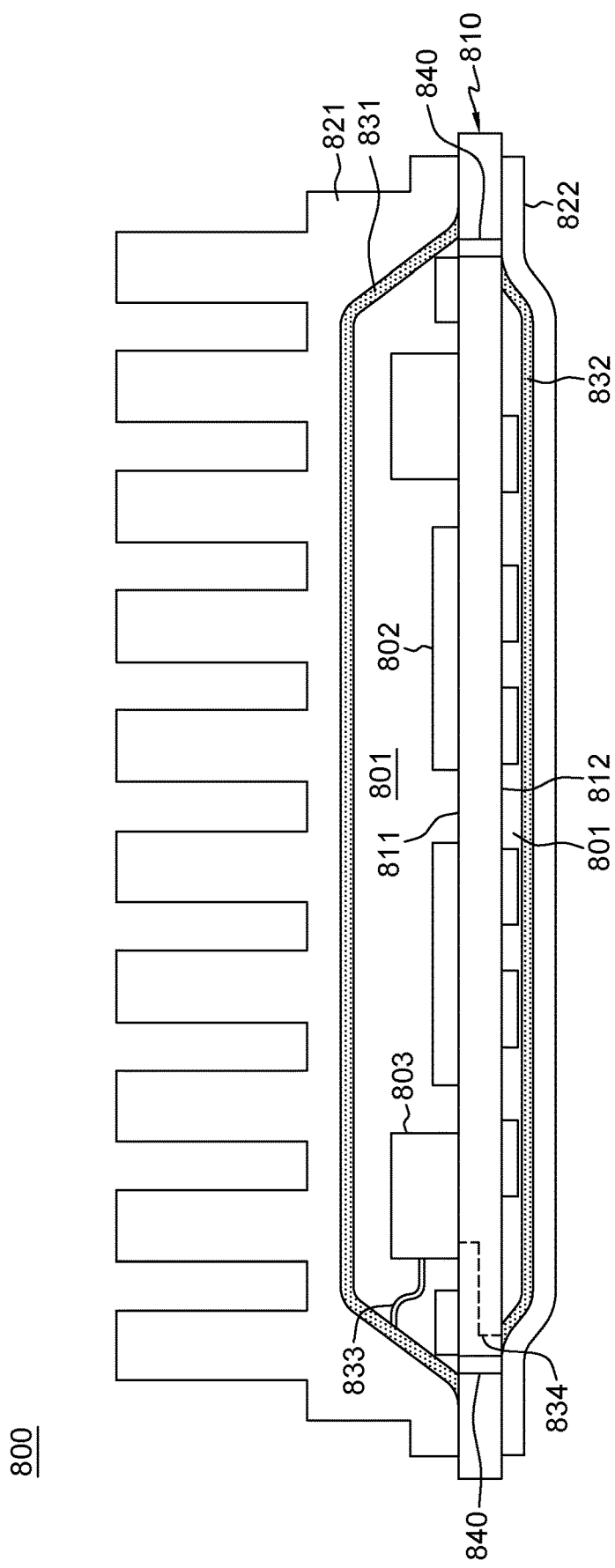
FIG. 8A is a partial cross-sectional elevational view of a further embodiment of a tamper-proof electronic package, or tamper-respondent assembly, in accordance with one or more aspects of the present invention.
Figure 8B:
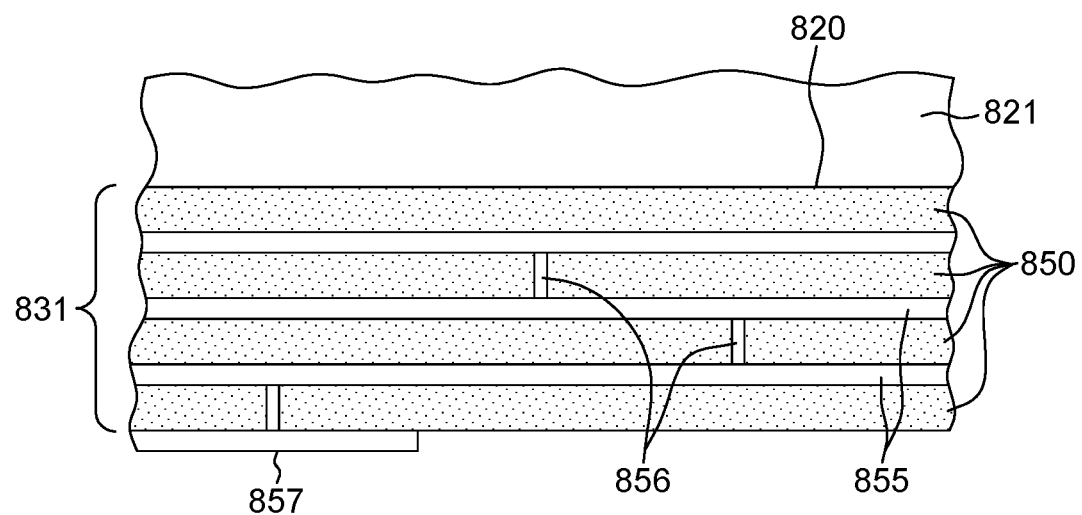
FIG. 8B is a partial cross-sectional elevational view of one embodiment of a tamper-respondent sensor for a tamper-respondent assembly such as depicted in FIG. 8A, in accordance with one or more aspects of the present invention.

FIGS. 8A & 8B depict one embodiment of a tamper-respondent assembly 800, in accordance with one or more aspects of the present invention. Referring first to FIG. 8A, tamper-respondent assembly 800 may include a circuit board 810 with opposite first and second sides 811, 812, each of which has respective electronic components mounted thereto, such as electronic components 802, 803, mounted to first side 811 of circuit board 810. In one or more embodiments, electronic component 803 may be or include monitor circuitry of the assembly, which as depicted, may be disposed within the resultant secure volume 801, and electrically connected to the tamper-detect circuit(s) of the tamper-respondent sensor(s) to monitor for a tamper event.

In the embodiment depicted in FIG. 8A, tamper-respondent assembly 800 includes a first cover 821, and a second cover 822 mounted to first side 811 and second side 812, respectively, of circuit board 810. In one or more implementations, first cover 821 and/or second cover 822 may be a thermally conductive cover formed, for instance, of a metal or metal alloy. Further, first cover 821 is shown with air-cooled fins projecting from the cover to facilitate transfer of heat from tamper-respondent assembly 800 to the surrounding air. Note that the particular cover configurations and profiles of first cover 821 and second cover 822 of FIG. 8A are presented by way of example only. For instance, the peripheral angles of the covers may vary as desired for a particular tamper-respondent assembly implementation. For example, in one or more other embodiments, the first and second covers may be identically configured.

In the embodiment depicted, first cover 821 and a first tamper-respondent sensor 831 affixed to an inner surface of first cover 821 form a first enclosure assembly mounted to first side 811 of circuit board 810 to enclose one or more electronic components 802, 803 in a first sealed chamber of secure volume 801. Similarly, a second tamper-respondent sensor 832 mounted to the inner surface of second cover 822 together define a second enclosure assembly mounted to second side 812 of circuit board 810 to enclose one or more further electronic components coupled to the second side of circuit board 810 within a second sealed chamber of secure volume 801. Note that in the example of FIG. 8A, secure volume 801 extends through and includes a portion of circuit board 810 by the provision of, for instance, one or more picket-fence-type tamper-detect circuits 840 extending through circuit board 810 at the periphery of secure volume 801. For instance, one or more rows of conductive vias may be stitched together in a picket-fence-type configuration as a tamper-detect circuit such that a tamper event would be incapable of reaching undetected into secure volume 801 through circuit board 810. Note that in one or more embodiments, each tamper-respondent sensor 831, 832 is a three-dimensional multilayer sensor structure that may be a single, molded, three-dimensional sensor structure formed of one or more respective liquid crystal polymer layers in solid form having integrated therewith one or more respective tamper-detect circuits, each including one or more circuit lines in a tamper-detect pattern disposed on at least one liquid crystal polymer layer of the liquid crystal polymer layer(s) in the sensor structure. Further, each three-dimensional multilayer sensor structure 831, 832 may be molded to the inner surface of the respective cover 821, 822 using, for instance, a respective molding process, such as described further below.

FIG. 8B depicts one example of tamper-respondent sensor 831 affixed to an inner surface 820 of first cover 821. As illustrated, tamper-respondent sensor 831 includes, in the example depicted, multiple liquid crystal polymer layers 850, one or more of which may include at least one tamper-detect circuit defined by one or more circuit lines 855 in a tamper-detect pattern disposed thereon. For instance, circuit lines 855 may be provided on one or more liquid crystal polymer layers 850, and one or more tamper-detect circuits may be defined by interconnecting the circuit lines using conductive vias 856 in the different layers. In the embodiment of FIG. 8B, one or more interconnect conductors 857 may be disposed within the secure volume in an area that facilitates connecting the tamper-detect circuit(s) to the tamper monitor circuitry via, for instance, an interconnecting wire(s) 833, and/or via one or more circuit lines disposed on or within the circuit board, such as the circuit line(s) 834 connecting second tamper-respondent sensor 832 to monitor circuitry 803 in the example of FIG. 8A. Note that in the embodiment of FIG. 8B the conductive vias 856 may be offset between the different layers, and may be, in one or more embodiments, protected by the tamper-detect circuit provided above their respective layer.

In one or more implementations, the multilayer sensor structures disclosed herein with one or more liquid crystal polymer layers may be produced using an appropriate build or stack up process with, for instance, the circuit lines in the tamper-detect pattern also being produced using an appropriate buildup process or, for example, via a partially subtractive process (where, for example, a conductor such as copper may be deposited and then patterned on one side of a liquid crystal polymer layer). In one or more embodiments, fabrication of the sensor structures disclosed herein could be analogous to fabrication of a multilayer circuit board such as described above in connection with FIG. 5, with appropriate material and process substitutions based on the description provided herein.

Figure 9:
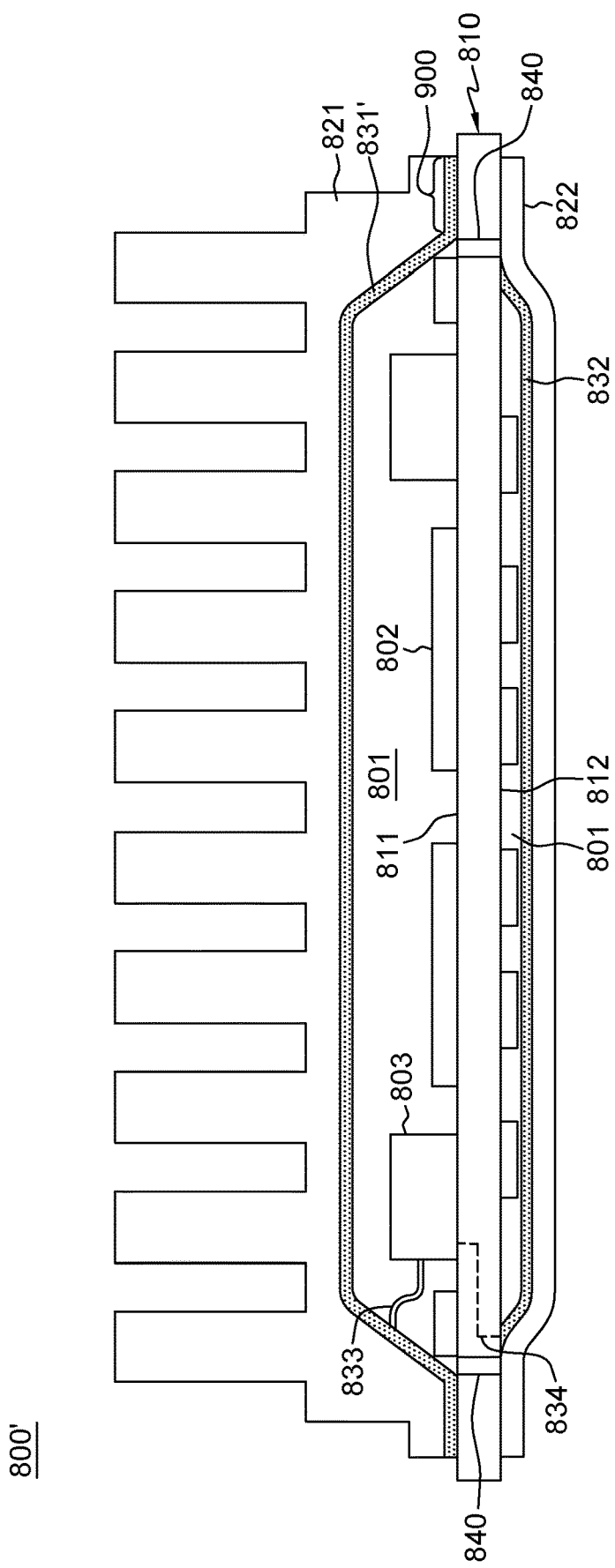
FIG. 9 is a cross-sectional elevational view of an alternate embodiment of a tamper-respondent assembly, in accordance with one or more aspects of the present invention.

FIG. 9 depicts an alternate embodiment of a tamper-respondent assembly 800' similar to tamper-respondent assembly 800 described above in connection with FIGS. 8A & 8B. In this embodiment, however, first tamper-respondent sensor 831' is sized and shaped to extend into the enclosure-to-board interface 900 region where first cover 821 mounts to circuit board 810. This configuration may provide enhance tamper-detect protection at the interface between first cover 821 and circuit board 810. Although not shown, a similar change to second tamper-respondent sensor 832 could be made in order for second tamper-respondent sensor 832 to extend into the corresponding enclosure-to-board interface region where second cover 822 mounts to circuit board 810. In one or more embodiments, the enclosure-to-board interface regions of first cover 821 to circuit board 810 and second cover 822 to circuit board 810 may align, and each cover may be, for instance, secured or mounted to the respective side of the circuit board using a structural adhesive, which may also be used in the case where the corresponding tamper-respondent sensor extends into the enclosure-to-board interface. For instance, the structural adhesive could be applied to both sides of the tamper-respondent sensor so as to affix the tamper-respondent sensor to both the respective cover 821 (or 822), and to circuit board 810.

Figure 10:
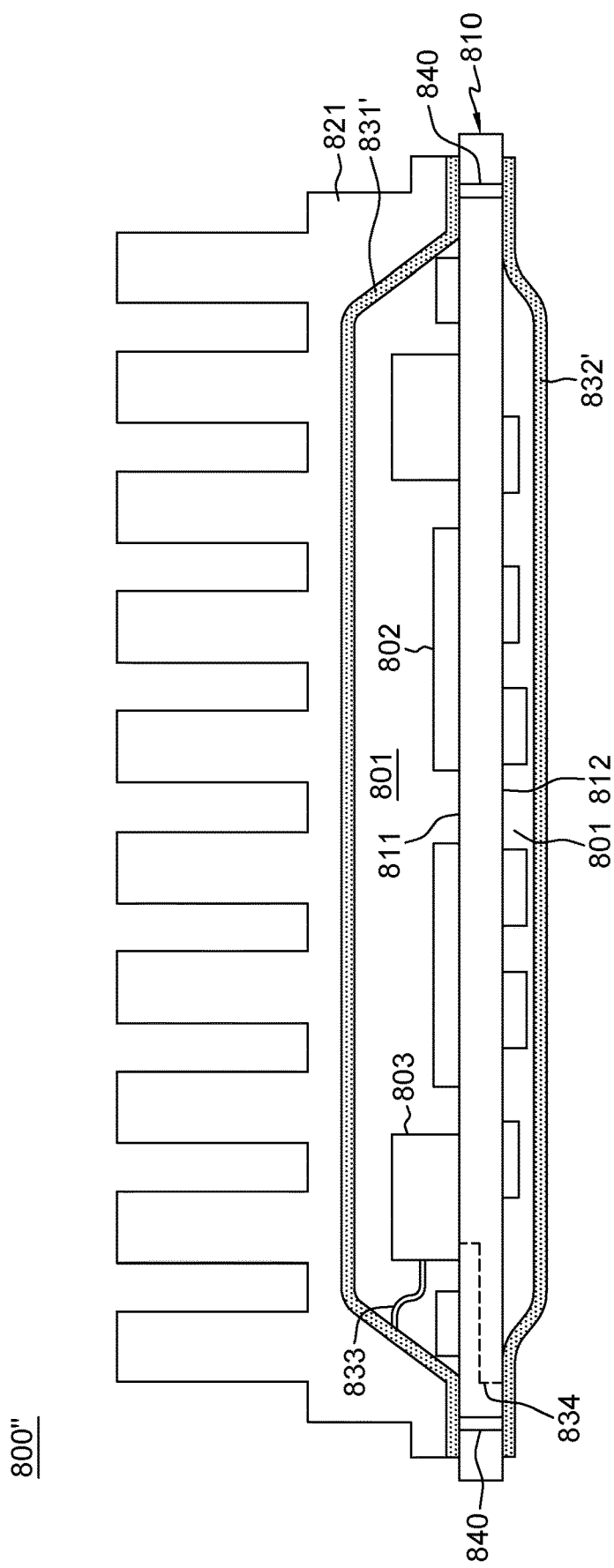
FIG. 10 is a cross-sectional elevational view of another alternate embodiment of a tamper-respondent assembly, in accordance with one or more aspects of the present invention.

FIG. 10 depicts a further alternative embodiment of a tamper-respondent assembly 800" that is similar to tamper-respondent assembly 800' of FIG. 9, and tamper-respondent assembly 800 of FIGS. 8A & 8B. In this configuration, first tamper-respondent sensor 831' of FIG. 9 is disposed between first cover 821 and circuit board 810, with first tamper-respondent sensor 831' being molded to the inner surface of first cover 821, as discussed herein. The variation depicted in FIG. 10 is that rather than having a separate second cover, such as second cover 822 of FIGS. 8A & 9, the second cover is removed and replaced with, for instance, only the second tamper-respondent sensor, and more particularly, the single, molded, three-dimensional sensor structure of the second tamper-respondent sensor 832'. Note that, in one or more embodiments, the thickness (as well as the number of layers) of the second tamper-respondent sensor 832' may be the same or may be different from that of the first tamper-respondent sensor 831'. When configured as the cover for second side 812, second tamper-respondent sensor 832' may be provided with different strength characteristics than first tamper-respondent sensor 831', which in the example shown may be mounted to the inner surface of first cover 821. For instance, second tamper-respondent sensor 832', formed (at least in part) of multiple liquid crystal polymer layers with the one or more tamper-detect circuits integrated therewith, may have a greater thickness than first tamper-respondent sensor 831'. Alternatively, or additionally, strength characteristics of the individual liquid crystal polymer layers of the multiple liquid crystal polymer layers of second tamper-respondent sensor 832' may be modified.

Figure 11:
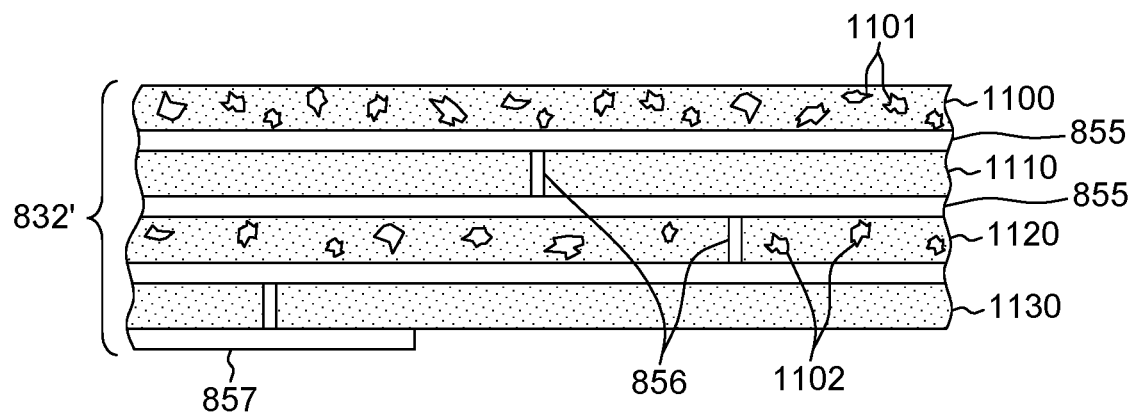
FIG. 11 is a partial cross-sectional elevational view of another embodiment of a tamper-respondent sensor for a tamper-respondent assembly, in accordance with one or more aspects of the present invention.

For example, reference FIG. 11 where one embodiment of second tamper-respondent sensor 832' is shown. In this embodiment, four liquid crystal polymer layers 1100, 1110, 1120 & 1130 are illustrated, which in one or more implementations, may be similar to liquid crystal polymer layers 850 described above in connection with FIG. 8B. For example, one or more of liquid crystal polymer layers 1100, 1110, 1120, 1130 may include at least one tamper-detect circuit comprising one or more circuit lines 855 in a tamper-detect pattern disposed thereon. Further, conductive vias 856 may be provided, as well as interconnect conductor(s) 857, as described above. Further, strength of the tamper-respondent sensor 832' may be enhanced by the inclusion of filler particles of a desired characteristic. By way of example only, in the implementation of FIG. 11, a first liquid crystal polymer layer 1100 includes filler material 1101, such as structural filler material, (for instance, glass, silica, ceramic) particles (or any other desired particles, such as conductive particles (e.g., boron nitride, aluminum silicon carbide)) to, for instance, make the layer more difficult to penetrate during a tamper event. In one or more implementations, it may be desirable to alternate providing filler particles in different layers of the multiple liquid crystal polymer layers 1100, 1110, 1120 & 1130. For instance, as shown, second liquid crystal polymer layer 1110 between first liquid crystal polymer layer 1100 and third liquid crystal polymer layer 1120 may lack the particle filler, as may the fourth liquid crystal polymer layer 1130. Further, the concentration of filler material may vary between the layers, with the concentration of filler material 1101 in first liquid crystal polymer layer 1100 being greater than the concentration of filler material 1102 in the third liquid crystal polymer layer 1120 shown by way of example only. Further, the types of filler particles used in the different liquid crystal polymer layers may vary, again as desired to obtain a particular strength or tamper-proof detection characteristic. For instance, by including filler particles in alternating layers of the liquid crystal polymer sensor structure, enhanced sensitivity to a tamper event may be obtained since the in between liquid crystal polymer layers 1110, 1130 without (or with less) filler may result in accuracy of drilling during a tamper event being compromised, thereby enhancing the likelihood of detection. Further, note that the concentration and type of filler material may be varied both locally and/or throughout the sensor structure to, for instance, enhance and/or vary mechanical strength, mechanical flexure, heat transfer, and/or enhance tamper detection, as desired for a particular application.

For instance, by modifying concentration and/or type of filler material in one or more of the layers of the liquid crystal polymer sensor structure, it is possible to tailor one or more surfaces of the sensor for, for instance, both penetration resistance during a tamper event and, for example, a minimized thermal expansion mismatch property with a cover, or other structure. This may be particularly advantageous when direct-bonding the liquid crystal polymer sensor structure to the cover in the absence of an adhesive material in between, such as described further below. Specifically, by using different fill concentrations in a layered liquid crystal polymer structure, it is possible to tune thermal expansion properties of the structure. When affixing the liquid crystal polymer sensor structure to various surfaces, this can be an advantageous attribute for enhancing reliability of the sensor circuit when exposed to thermal cycling or power on-off cycling. For example, thermal expansion properties of a layered liquid crystal polymer sensor structure may be functionally graduated from an outer bonding surface with the cover in order to more closely match the cover's thermal expansion properties to minimize potential for wear-out induced failure from thermal cycling or power cycling. Similarly, if components are affixed to a surface of the liquid crystal polymer sensor structure, the structure's properties can be tuned to more closely match expansion properties of those components contacting or mounted to the surface of the sensor structure to prevent wear-out failure of the tamper-respondent assembly.

Note also that the liquid crystal polymer layers of the three-dimensional multilayer sensor structures disclosed herein may advantageously provide opacity to the enclosure, whether used on the inner surface of a cover such as a thermally conductive cover, or as the cover itself, as explained herein. This opacity advantageously prevents an intruder from having visibility to, for instance, the circuit lines of the tamper-detect circuit(s) within the three-dimensional multilayer sensor structure. As noted, use of a resistive material such as NiCr, NiP or other resistive material, may also advantageously provide protection against x-ray imaging.

Figure 12:
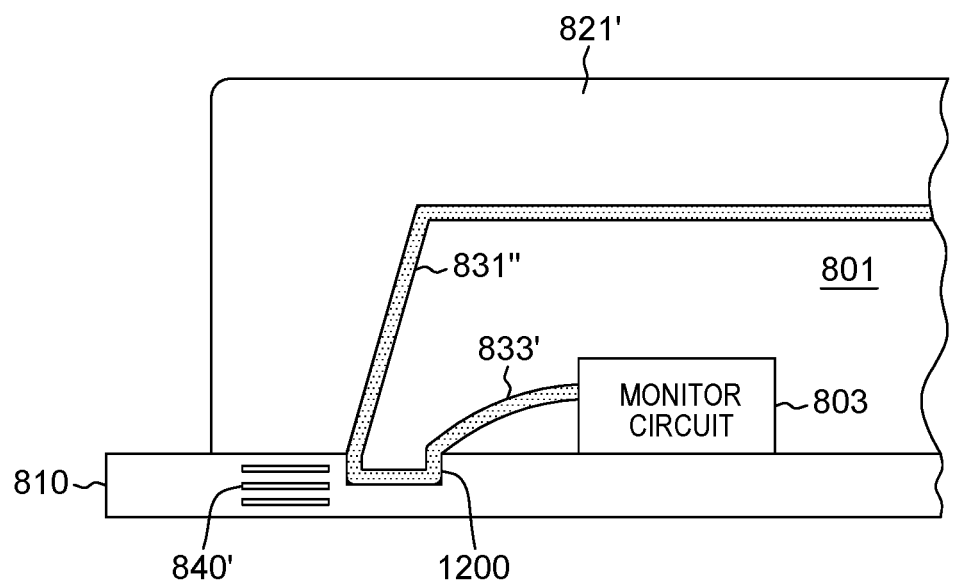
FIG. 12 is a partial cross-sectional elevational view of a further embodiment of a tamper-respondent assembly with a tamper-respondent sensor, in accordance with one or more aspects of the present invention.

FIG. 12 depicts another variation on the tamper-respondent assemblies disclosed herein, wherein a cover 821' is shown mounted to a main surface of circuit board 810 which has one or more electronic components including an electronic component 803 which may include monitor circuitry disposed within secure volume 801. In this example, the tamper-respondent sensor, such as first tamper-respondent sensor 831" is secured to the inner surface of cover 821' and includes a connection tab 833' formed as part of the three-dimensional multilayer sensor structure itself. As shown, a notch or groove 1200 may be provided on the surface of circuit board 810 to align with connection tab 833' and allow for the tab to extend down into the notch and thereby facilitate molding of the tamper-respondent sensor 831" to the inner surface of cover 821' in the region of the enclosure-to-board interface. As shown, connection tab 833' may extend from tamper-respondent sensor 831" to electrically connect to the monitor circuitry of electronic component 803, with the connection tab extending, at least in part, into notch 1200 in the surface of circuit board 810 in operative position. Note also in the embodiment of FIG. 12 that rather than a picket fence type board protection at the periphery of secure volume 801 within circuit board 810, one or more frame-type tamper-respondent sensors 840' may be embedded within circuit board 810, such as the frame-type sensors described above in connection with FIG. 4. Although not shown, the embodiment also assumes the presence of a second tamper-respondent sensor and cover assembly on the opposite, bottom surface of circuit board 810 in the orientation of FIG. 12 to complete definition of the secure volume.

Figure 13:
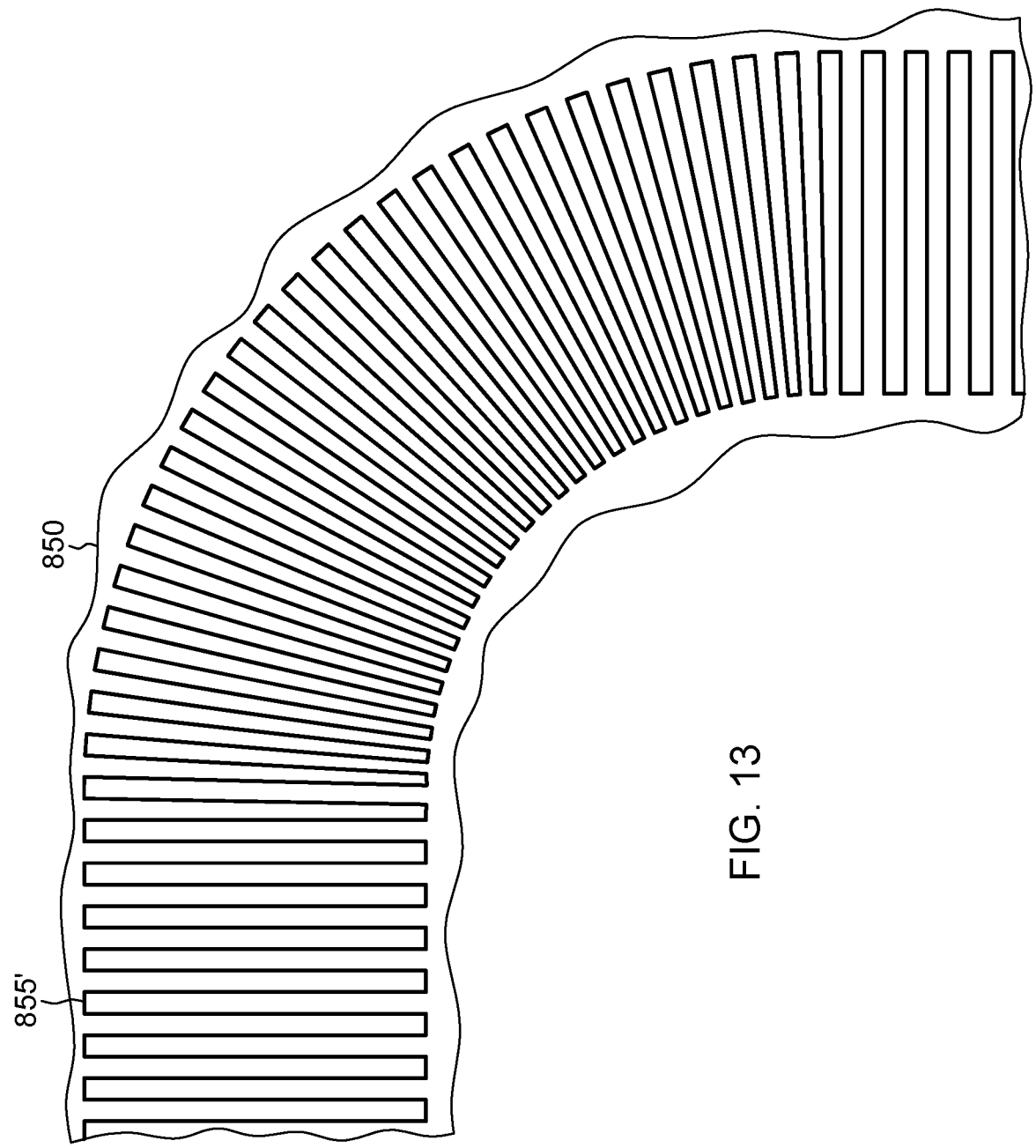
FIG. 13 depicts one embodiment of a tamper-respondent sensor with a patterned circuit line on a liquid crystal polymer layer configured for molding of the tamper-respondent sensor about a corner of an enclosure assembly of a tamper-respondent assembly, in accordance with one or more aspects of the present invention.

As noted, in one or more implementations, the circuit lines of the tamper-detect circuit(s) within the individual three-dimensional multilayer sensor structure may be formed on the respective liquid crystal polymer layers before molding of the three-dimensional multilayer sensor structure to a final configuration. Providing the circuit lines as straight traces before molding the multiple liquid crystal polymer layers could potentially result in deformation of the designed circuit mesh in, for instance, regions of the three-dimensional multilayer sensor structure where curved, for instance, on the inner corners of a cover of the respective enclosure assembly. As shown in FIG. 13, in one or more embodiments, this may be addressed by printing modeled conductive lines, such as a modeled serpentine trace 855' pattern onto the respective liquid crystal polymer layer 850 in a non-uniform manner designed to accommodate conductive line deformation during the molding of the three-dimensional multilayer sensor structure to achieve, post molding, the optimized or desired tamper-detect circuit design for, for instance, trace-to-trace spacing about the corners of the molded, three-dimensional multilayer sensor structure. This may be facilitated by using computer simulation to simulate flow of liquid crystal polymer material during molding, and thus stretching or movement of the circuit lines on the individual liquid crystal polymer layers. Using computer simulation, the applied tamper-detect pattern of the circuit lines on one or more of the liquid crystal polymer layers may be nonuniform prior to molding, with the desired spacing being achieved post molding.

Figure 14:
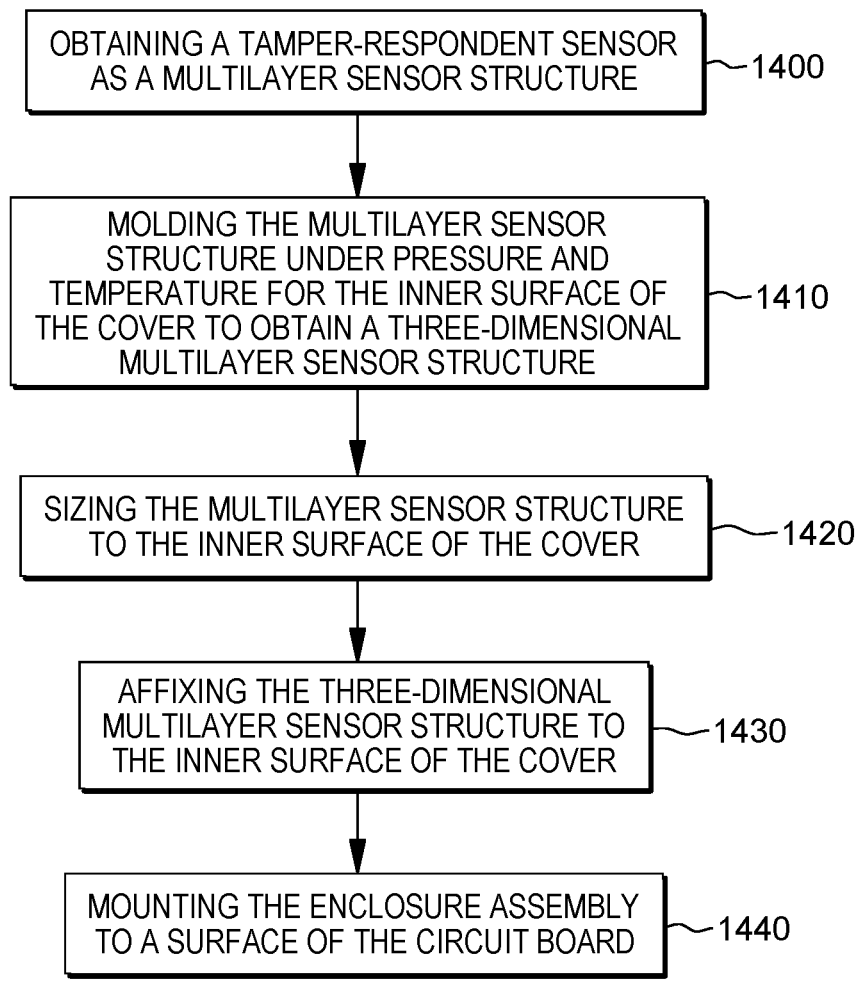
FIG. 14 depicts one embodiment of a process of fabricating a tamper-respondent assembly, in accordance with one or more aspects of the present invention.

By way of further explanation, FIG. 14 depicts one embodiment of a process for fabricating a tamper-respondent assembly, in accordance with one or more aspects of the present invention. Referring to FIG. 14, a tamper-respondent sensor is obtained as a multilayer sensor structure 1400. For instance, a sheet of the multilayer sensor structure may be obtained, or fabricated; and using, for instance, a laser cutting tool, the multilayer sensor structure may be cut to fit into the molding tool.

The process includes molding the multilayer sensor structure under pressure and temperature to, for instance, mate to the inner surface of a cover of the enclosure assembly, resulting in a three-dimensional multilayer sensor structure 1410. For instance, an appropriately configured molding tool may be used to form the three-dimensional multilayer sensor structure using a relatively low temperature of, for instance, 150° C. under load for approximately 5 minutes. When finished, the multilayer sensor structure is allowed to cool to room temperature.

The multilayer sensor structure may then be sized to the inner surface of the cover by, for instance, cutting the sheet down from the molded multilayer sensor structure. In one or more embodiments, the three-dimensional multilayer sensor structure may then be affixed to the inner surface of the cover 1430. For instance, this may be achieved by providing a layer of adhesive on or over the inner surface of the cover and mounting the three-dimensional multilayer sensor structure onto the cover with the adhesive. Securing of the sensor structure in place may involve placing a load in an assembly fixture and curing, for instance, at 120° C. for a period of time, such as 1-2 hours. After curing, the assembly may be allowed to cool to room temperature. Once the three-dimensional multilayer sensor structure is affixed to the inner surface of the cover, the enclosure assembly may be mounted to a surface of the circuit board 1440 to continue with fabrication of the tamper-respondent assembly. As part of this process, electrical connection is made between the tamper-detect circuit(s) of the multilayer sensor structure and the monitor circuitry of the assembly.

Note that optionally, the three-dimensional multilayer sensor structure could be direct bonded to the inner surface of the cover without use of an adhesive by relying on an adhesive bonding of the three-dimensional multilayer sensor structure itself. For instance, by exposing the enclosure assembly exposure to a temperature sufficient to render thermal plastic flow of the base liquid crystal polymer layer to the inner surface of the cover. With such a direct bonding option, surface treatments of the inner surface of the cover may be used, such as a mechanical roughening or chemical activation treatment(s), to enhance adhesion of the three-dimensional multilayer sensor structure to the inner surface of the cover.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A tamper-respondent assembly comprising:
a circuit board;
an enclosure assembly mounted to the circuit board to enclose at least one electronic component coupled to the circuit board within at least one sealed chamber of a secure volume, the enclosure assembly comprising:
a tamper-respondent sensor, the tamper-respondent sensor being a rigid three-dimensional multilayer sensor structure comprising:
multiple liquid crystal polymer layers in solid form;
at least one tamper-detect circuit, the at least one tamper-detect circuit comprising one or more circuit lines in a tamper-detect pattern disposed on at least one liquid crystal polymer layer of the multiple liquid crystal polymer layers; and wherein the rigid three-dimensional multilayer sensor structure is a single, molded, three-dimensional multilayer sensor structure, and one or more liquid crystal polymer layers of the multiple liquid crystal polymer layers of the tamper-respondent sensor comprise structural support particles embedded within the liquid crystal polymer layer that are a different material from the liquid crystal polymer in solid form to provide enhanced structural rigidity to the one or more liquid crystal polymer layers in solid form, the structural support particles facilitating inhibiting physical penetration of the tamper-respondent sensor during the tamper event; and
a monitor circuit disposed within the secure volume to monitor the at least one tamper-detect circuit of the tamper-respondent sensor for a tamper event.

2. The tamper-respondent assembly of claim 1, wherein the enclosure assembly comprises a cover, the cover being defined by the molded, three-dimensional multilayer sensor structure itself, without presence of a separate cover structure.

3. The tamper-respondent assembly of claim 1, wherein the enclosure assembly further includes a thermally conductive cover, the rigid three-dimensional multilayer sensor structure being affixed to an inner surface of the thermally conductive cover.

4. The tamper-respondent assembly of claim 3, wherein the tamper-respondent sensor is molded to conform to the inner surface of the thermally conductive cover.

5. The tamper-respondent assembly of claim 3, wherein the thermally conductive cover mounts to the circuit board at an enclosure-to-board interface, and the tamper-respondent sensor extends, at least in part, into the enclosure-to-board interface, between the thermally conductive cover and the circuit board.

6. The tamper-respondent assembly of claim 1, wherein the multiple liquid crystal polymer layers of the tamper-respondent sensor are opaque layers, and the one or more circuit lines of the at least one tamper-detect circuit are formed of a resistive material invisible to x-ray imaging.

7. The tamper-respondent assembly of claim 1, wherein at least two liquid crystal polymer layers of the multiple liquid crystal polymer layers in solid form comprise filler particles different from the liquid crystal polymer, a first liquid crystal polymer layer of the at least two liquid crystal polymer layers comprising a first concentration of the filler particles and a second liquid crystal polymer layer of the at least two liquid crystal polymer layers comprising a second concentration of the filler particles, the first concentration of the filler particles being greater than the second concentration of the filler particles.

8. The tamper-respondent assembly of claim 7, wherein the second liquid crystal polymer layer of the at least two liquid crystal polymer layers is disposed closer to the secure volume than the first liquid crystal polymer layer.

9. The tamper-respondent assembly of claim 7, wherein one or more other liquid crystal polymer layers of the multiple liquid crystal polymer layers are disposed in between the at least two liquid crystal polymer layers in the three-dimensional multilayer sensor structure, the one or more other liquid crystal polymer layers lacking the filler particles or having less filler particles than the at least two liquid crystal polymer layers.

10. A tamper-respondent assembly comprising:
a circuit board;
an enclosure assembly mounted to the circuit board to enclose at least one electronic component coupled to the circuit board within at least one sealed chamber of a secure volume, the enclosure assembly comprising:
　a tamper-respondent sensor, the tamper-respondent sensor being a rigid three-dimensional multilayer sensor structure comprising:
　　multiple liquid crystal polymer layers in solid form;
　　at least one tamper-detect circuit, the at least one tamper-detect circuit comprising one or more circuit lines in a tamper-detect pattern disposed on at least one liquid crystal polymer layer of the multiple liquid crystal polymer layers; and
　　wherein the rigid three-dimensional multilayer sensor structure is a single, molded, three-dimensional multilayer sensor structure; and
　a monitor circuit disposed within the secure volume to monitor the at least one tamper-detect circuit of the tamper-respondent sensor for a tamper event; and
wherein the tamper-respondent sensor includes a connection tab extending therefrom to facilitate electrically connecting the at least one tamper-detect circuit to the monitor circuit, and the circuit board includes a notch in a surface thereof within the secure volume, the connection tab of the tamper-respondent sensor extending, at least in part, into the notch in the surface of the circuit board in operative position connecting the at least one tamper-detect circuit to the monitor circuit.

11. A tamper-respondent assembly comprising:
a circuit board comprising a first side and a second side, the first side and the second side being opposite sides of the circuit board;
multiple electronic components, including at least one first electronic component coupled to the first side of the circuit board and at least one second electronic component coupled to the second side of the circuit board;
a first enclosure assembly mounted to the first side of the circuit board to enclose the at least one first electronic component coupled to the first side of the circuit board within a first sealed chamber of a secure volume, the first enclosure assembly comprising:
a first tamper-respondent sensor, the first tamper-respondent sensor being a first three-dimensional multilayer sensor structure comprising:
　multiple liquid crystal polymer layers; and
　at least one first tamper-detect circuit, the at least one first tamper-detect circuit comprising one or more circuit lines in a tamper-detect pattern disposed on at least one liquid crystal polymer layer of the multiple liquid crystal polymer layers;
a second enclosure assembly mounted to the second side of the circuit board to enclose the at least one second electronic component coupled to the second side of the circuit board within a second sealed chamber of the secure volume, the second enclosure assembly comprising:
a second tamper-respondent sensor, the second tamper-respondent sensor being a second three-dimensional multilayer sensor structure comprising:
　multiple liquid crystal polymer layers; and
　at least one second tamper-detect circuit, the at least one second tamper-detect circuit comprising one or more circuit lines in a tamper-detect pattern disposed on at least one liquid crystal polymer layer of the multiple liquid crystal polymer layers of the second tamper-respondent sensor; and a monitor circuit disposed within the secure volume to monitor the at least one first tamper-detect circuit of the first tamper-respondent sensor and to monitor the at least one second tamper-detect circuit of the second tamper-respondent sensor for a tamper event.

12. The tamper-respondent assembly of claim 11, wherein the first three-dimensional multilayer sensor structure and the second three-dimensional multilayer sensor structure are each a single, molded, three-dimensional multilayer sensor structure formed, at least in part, pursuant to a respective molding process.

13. The tamper-respondent assembly of claim 11, wherein one or more liquid crystal polymer layers of the multiple crystal polymer layers of at least one of the first tamper-respondent sensor or the second tamper-respondent sensor comprise structural filler material different from liquid crystal polymer material to, at least in part, provide enhanced structural rigidity to the one or more liquid crystal polymer layers to facilitate inhibiting penetration of the tamper-respondent assembly during the tamper event.

14. The tamper-respondent assembly of claim 11, wherein at least two liquid crystal polymer layers of the multiple liquid crystal polymer layers of at least one of the first tamper-respondent sensor or the second tamper-respondent sensor comprise filler material different from liquid crystal polymer material, a first liquid crystal polymer layer of the at least two liquid crystal polymer layers comprising a first concentration of the filler material and a second liquid crystal polymer layer of the at least two liquid crystal polymer layers comprising a second concentration of the filler material, the first concentration of the filler material being greater than the second concentration of the filler material.

* * * * *